(12) United States Patent
Ikeda

(10) Patent No.: US 10,237,558 B2
(45) Date of Patent: Mar. 19, 2019

(54) ENCODER, DECODER, ENCODING METHOD, AND DECODING METHOD

(71) Applicant: Panasonic Intellectual Property Corporation of America, Torrance, CA (US)

(72) Inventor: Tatsuhiko Ikeda, Kyoto (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 0 days.

(21) Appl. No.: 16/055,764

(22) Filed: Aug. 6, 2018

(65) Prior Publication Data

US 2019/0052883 A1 Feb. 14, 2019

(30) Foreign Application Priority Data

Aug. 9, 2017 (JP) ................................ 2017-154776

(51) Int. Cl.
| | |
|---|---|
| *H03M 7/00* | (2006.01) |
| *H04N 19/13* | (2014.01) |
| *H04N 19/61* | (2014.01) |
| *H03M 7/30* | (2006.01) |
| *H03M 7/40* | (2006.01) |
| *H04N 19/56* | (2014.01) |
| *H04N 19/159* | (2014.01) |
| *H04N 19/117* | (2014.01) |

(Continued)

(52) U.S. Cl.
CPC .......... *H04N 19/13* (2014.11); *H03M 7/4006* (2013.01); *H03M 7/6005* (2013.01); *H03M 7/6035* (2013.01); *H04N 19/61* (2014.11); *H04N 19/103* (2014.11); *H04N 19/117* (2014.11); *H04N 19/119* (2014.11); *H04N 19/159* (2014.11); *H04N 19/176* (2014.11); *H04N 19/44* (2014.11); *H04N 19/52* (2014.11); *H04N 19/56* (2014.11); *H04N 19/70* (2014.11); *H04N 19/96* (2014.11)

(58) Field of Classification Search
CPC ...... H04N 19/52; H04N 19/44; H04N 19/176; H04N 19/70; H04N 19/117; H04N 19/119; H04N 19/96; H04N 19/103; H04N 19/56; H04N 19/159
USPC .................................... 341/107, 106, 50, 51
See application file for complete search history.

(56) References Cited

U.S. PATENT DOCUMENTS

2016/0286232 A1* 9/2016 Li ........................ H04N 19/513

OTHER PUBLICATIONS

Adrian Grange et al., "VP9 Bitstream & Decoding Process Specification", Version 0.6, Mar. 31, 2016.

* cited by examiner

*Primary Examiner* — Joseph Lauture
(74) *Attorney, Agent, or Firm* — Wenderoth, Lind & Ponack, L.L.P.

(57) ABSTRACT

An encoder includes processing circuitry, a block memory, and a frame memory. The processing circuitry defines at least one parameter for each of plural types of segment_ids, splits an image into blocks, assigns, to each of the blocks, segment_id according to a type of the block, among the plural types of segment_ids, and sequentially encodes the blocks. In encoding the blocks, the processing circuitry identifies segment_id of a current block to be encoded, and encodes the current block using the at least one parameter defined for identified segment_id. The at least one parameter includes seg_context_idx for identifying probability information associated with context used in context-based adaptive binary arithmetic coding (CABAC).

10 Claims, 27 Drawing Sheets

(51) Int. Cl.
*H04N 19/70* (2014.01)
*H04N 19/96* (2014.01)
*H04N 19/176* (2014.01)
*H04N 19/52* (2014.01)
*H04N 19/103* (2014.01)
*H04N 19/44* (2014.01)
*H04N 19/119* (2014.01)

FIG. 3

| TRANSFORM TYPE | BASIS FUNCTION $T_i(j)$, $i, j = 0, 1, ..., N-1$ |
|---|---|
| DCT-II | $T_i(j) = \omega_0 \cdot \sqrt{\dfrac{2}{N}} \cdot \cos\left(\dfrac{\pi \cdot i \cdot (2j+1)}{2N}\right)$<br>WHERE $\omega_0 = \begin{cases} \sqrt{\dfrac{2}{N}} & i = 0 \\ 1 & i \neq 0 \end{cases}$ |
| DCT-V | $T_i(j) = \omega_0 \cdot \omega_1 \cdot \sqrt{\dfrac{2}{2N-1}} \cdot \cos\left(\dfrac{2\pi \cdot i \cdot j}{2N-1}\right)$<br>WHERE $\omega_0 = \begin{cases} \sqrt{\dfrac{2}{N}} & i = 0 \\ 1 & i \neq 0 \end{cases}$, $\omega_1 = \begin{cases} \sqrt{\dfrac{2}{N}} & j = 0 \\ 1 & j \neq 0 \end{cases}$ |
| DCT-VIII | $T_i(j) = \sqrt{\dfrac{4}{2N+1}} \cdot \cos\left(\dfrac{\pi \cdot (2i+1) \cdot (2j+1)}{4N+2}\right)$ |
| DST-I | $T_i(j) = \sqrt{\dfrac{2}{N+1}} \cdot \sin\left(\dfrac{\pi \cdot (i+1) \cdot (j+1)}{N+1}\right)$ |
| DST-VII | $T_i(j) = \sqrt{\dfrac{4}{2N+1}} \cdot \sin\left(\dfrac{\pi \cdot (2i+1) \cdot (j+1)}{2N+1}\right)$ |

| segment_id | QP | LF level | REF picture | SKIP |
|---|---|---|---|---|
| #0 | 13 | 15 | Last | 0 |
| #1 | 22 | 15 | Last | 0 |
| #2 | 31 | 30 | Last | 0 |
| #3 | 66 | 38 | Altref | 0 |
| #4 | 40 | 25 | Last | 0 |
| #5 | 20 | 50 | Golden | 1 |
| #6 | 35 | 44 | Altref | 0 |

```
segment_param{
for (depth =0, depth < max_depth, depth++) {
  for (i=0,  I < segment_num, i++) {
    skip_segment
    if (!skip_segment) {
      inter_intra
      segment_id (i, inter_intra)= inter_intra
      QP
      segment_id (i, seg_QP) = QP
      ref_picture
      segment_id (i, seg_REFPIC) = ref_picture
      SKIP
    segment_id (i, seg_SKIP) = SKIP
    context_id
      segment_id (i, seg_context_idx) =   context_id
       ...
    }
  }
}
```

FIG. 15

| depth | segment_id | inter_intra | seg_QP | seg_REFPIC | seg_SKIP | seg_context_idx |
|---|---|---|---|---|---|---|
| 0 | #0 | 1: Inter | 13 | 0 | 0 | context #0-0 |
| 0 | #1 | 1: Inter | 22 | 0 | 0 | context #0-1 |
| 0 | #2 | 1: Inter | 31 | 3 | 0 | context #0-2 |
| 0 | #3 | 0: Intra | 66 | – | 0 | context #0-3 |
| 1 | #0 | 1: Inter | 40 | 1 | 1 | context #1-0 |
| 1 | #1 | 0: Intra | 20 | – | 0 | context #1-1 |
| 1 | #2 | 2: explicit | 35 | explicit | 0 | context #1-2 |

FIG. 16A

```
Picture {
num_blocks = 0
for (i=0, i<num_superblock, i++)
    block_partition (0)
/
block_partition (depth)
    split_block
    if (split_block & depth < max_depth)
        block_partition (depth++)
    else
        segment_id(i)
        block_segment(num_block) = depth
        num_blocks ++
/
for (i=0, i<num_blocks, i++)
    block(i)
}
```

FIG. 16B

| block_partition | segment_id | POSITION OF SUPERBLOCK |
|---|---|---|
| 0 | #0 | UPPER LEFTMOST |
| 0 | #0 | SECOND LEFTMOST IN TOP ROW |
| 0 | #0 | THIRD LEFTMOST IN TOP ROW |
| 0 | #0 | FOURTH LEFTMOST IN TOP ROW |
| 0 | #0 | FIFTH LEFTMOST IN TOP ROW |
| 0 | #0 | SIXTH LEFTMOST IN TOP ROW |
| 0 | #1 | LEFTMOST IN SECOND ROW FROM TOP |
| 1 | | SECOND LEFTMOST IN SECOND ROW FROM TOP |
| 0 | #0 | SECOND LEFTMOST IN SECOND ROW FROM TOP (UPPER LEFT SUBBLOCK) |
| 0 | #0 | SECOND LEFTMOST IN SECOND ROW FROM TOP (UPPER RIGHT SUBBLOCK) |
| 0 | #0 | SECOND LEFTMOST IN SECOND ROW FROM TOP (LOWER LEFT SUBBLOCK) |
| 0 | #0 | SECOND LEFTMOST IN SECOND ROW FROM TOP (LOWER RIGHT SUBBLOCK) |

FIG. 17

```
block (block_num) {
depth = block_segment(block_num)
   if segment_id (depth, block_num, inter_intra) = explicit
      inter_intra
   else
      inter_intra = segment_id (depth, block_num, inter_intra)
/
   if (segment_id (depth, block_num, seg_QP) = explicit)
      QP
   else
      QP = segment_id (depth, block_num, seg_QP)
/
   if (segment_id (depth, block_num, seg_REFPIC) = explicit)
      ref_picture
   else
      ref_picture = segment_id (depth, block_num, seg_REFPIC)
/
   if (segment_id (depth, block_num, seg_SKIP) = explicit)
      SKIP
   else
      SKIP = segment_id (depth, block_num, seg_SKIP)
/
   if (segment_id (depth, block_num, seg_context_idx) = explicit)
      context_id
   else
      context_id = segment_id (depth, block_num, seg_context_idx)
/
   other data ...
}
```

FIG. 18

ENCODER, DECODER, ENCODING METHOD, AND DECODING METHOD

CROSS REFERENCE TO RELATED APPLICATION

This application claims the benefit of priority of Japanese Patent Application Number 2017-154776 filed on Aug. 9, 2017, the entire content of which is hereby incorporated by reference.

BACKGROUND

1. Technical Field

The present disclosure relates to a device which encodes an image, a method for encoding an image, a device which decodes an encoded image, and a method for decoding an encoded image.

2. Description of the Related Art

Currently, VP9 has been developed as an image coding standard (see "VP9 Bitstream & Decoding Process Specification Version 0.6", for example). According to this standard, a video is compression-encoded using, for instance, intra prediction and inter prediction, and the compression-encoded video is decoded, similarly to High-Efficiency Video Coding (HEVC).

SUMMARY

However, it is still possible to improve coding efficiency of a conventional encoder and a conventional decoder.

In view of this, the present disclosure provides an encoder and a decoder which improve coding efficiency, and others.

An encoder according to an aspect of the present disclosure includes: processing circuitry; and a memory coupled to the processing circuitry, wherein using the memory, the processing circuitry defines at least one parameter for each of plural types of segment identification information for identifying block types, splits an image into blocks, assigns, to each of the blocks, segment identification information according to a type of the block, among the plural types of segment identification information, and encodes each of the blocks, and in encoding each of the blocks, the processing circuitry identifies, among the plural types of segment identification information, segment identification information assigned to a current block to be encoded among the blocks, and encodes the current block using the at least one parameter defined for the segment identification information identified, and the at least one parameter includes a parameter for identifying probability information associated with context used in context-based adaptive binary arithmetic coding (CABAC).

It should be noted that such general and particular aspects may be implemented using a system, a method, an integrated circuit, a computer program, a computer-readable recording medium such as a CD-ROM, or any combination of systems, methods, integrated circuits, computer programs, and recording media.

The encoder and the decoder according to the present disclosure achieve improvement in coding efficiency.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3 is a chart indicating transform basis functions for each transform type;

FIG. 11 illustrates examples of segment_ids given to blocks in a picture;

FIG. 12 illustrates examples of parameter sets associated with numbers indicated by segment_ids;

FIG. 13 illustrates examples of segment_ids assigned to blocks in a picture in Embodiment 2;

FIG. 14 illustrates an example of syntax for defining parameters in a picture parameter set in Embodiment 2;

FIG. 15 illustrates examples of parameters associated with combinations of depth and segment_id defined in a picture parameter set, in Embodiment 2;

FIG. 16A illustrates an example of syntax for block splitting and assignment of segment_ids to blocks in Embodiment 2;

FIG. 16B illustrates examples of block_partition and segment_ids of blocks in Embodiment 2;

FIG. 17 illustrates an example of syntax for obtaining parameters to be applied to blocks in Embodiment 2;

FIG. 18 illustrates an example of order of encoding blocks obtained by splitting a picture in Embodiment 2;

DETAILED DESCRIPTION OF THE EMBODIMENTS

Hereinafter, embodiments will be described with reference to the drawings.

Note that the embodiments described below each show a general or specific example. The numerical values, shapes, materials, components, the arrangement and connection of the components, steps, order of the steps, etc., indicated in the following embodiments are mere examples, and therefore are not intended to limit the scope of the claims. Therefore, among the components in the following embodiments, those not recited in any of the independent claims defining the broadest inventive concepts are described as optional components.

Embodiment 1

(Encoder Outline)

Figure 1:
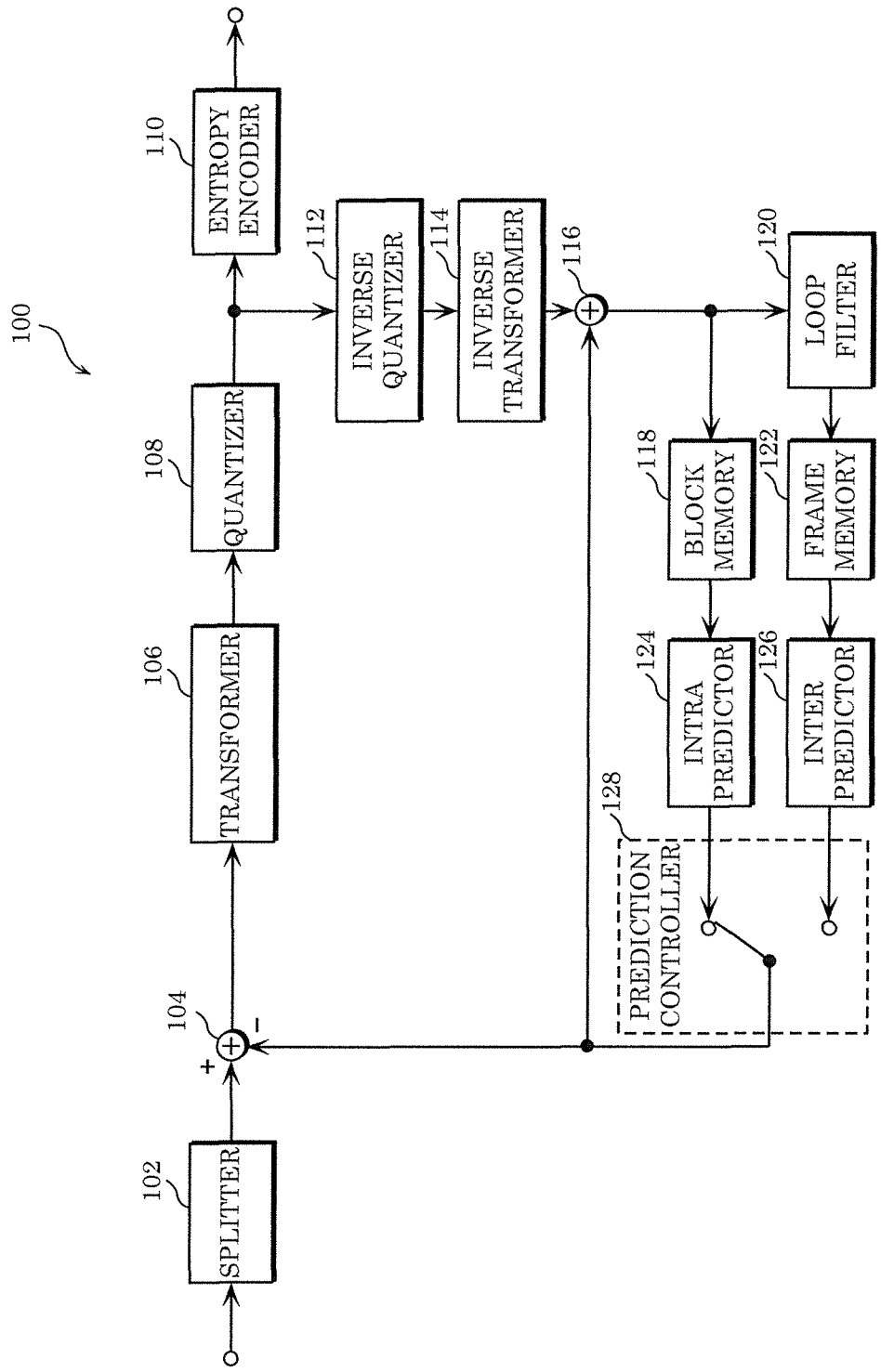
FIG. 1 is a block diagram illustrating a functional configuration of the encoder according to Embodiment 1.

First, the encoder according to Embodiment 1 will be outlined. FIG. 1 is a block diagram illustrating a functional configuration of encoder 100 according to Embodiment 1. Encoder 100 is a moving picture/picture encoder that encodes a moving picture/picture block by block.

As illustrated in FIG. 1, encoder 100 is a device that encodes a picture block by block, and includes splitter 102, subtractor 104, transformer 106, quantizer 108, entropy encoder 110, inverse quantizer 112, inverse transformer 114, adder 116, block memory 118, loop filter 120, frame memory 122, intra predictor 124, inter predictor 126, and prediction controller 128.

Encoder 100 is realized as, for example, a generic processor and memory. In this case, when a software program stored in the memory is executed by the processor, the processor functions as splitter 102, subtractor 104, transformer 106, quantizer 108, entropy encoder 110, inverse quantizer 112, inverse transformer 114, adder 116, loop filter 120, intra predictor 124, inter predictor 126, and prediction controller 128. Alternatively, encoder 100 may be realized as one or more dedicated electronic circuits corresponding to splitter 102, subtractor 104, transformer 106, quantizer 108, entropy encoder 110, inverse quantizer 112, inverse transformer 114, adder 116, loop filter 120, intra predictor 124, inter predictor 126, and prediction controller 128.

Hereinafter, each component included in encoder 100 will be described.

(Splitter)

Splitter 102 splits each picture included in an input moving picture into blocks, and outputs each block to subtractor 104. For example, splitter 102 first splits a picture into blocks of a fixed size (for example, 128×128). The fixed size block is also referred to as coding tree unit (CTU). Splitter 102 then splits each fixed size block into blocks of variable sizes (for example, 64×64 or smaller), based on recursive quadtree and/or binary tree block splitting. The variable size block is also referred to as a coding unit (CU), a prediction unit (PU), or a transform unit (TU). Note that in this embodiment, there is no need to differentiate between CU, PU, and TU; all or some of the blocks in a picture may be processed per CU, PU, or TU.

Figure 2:
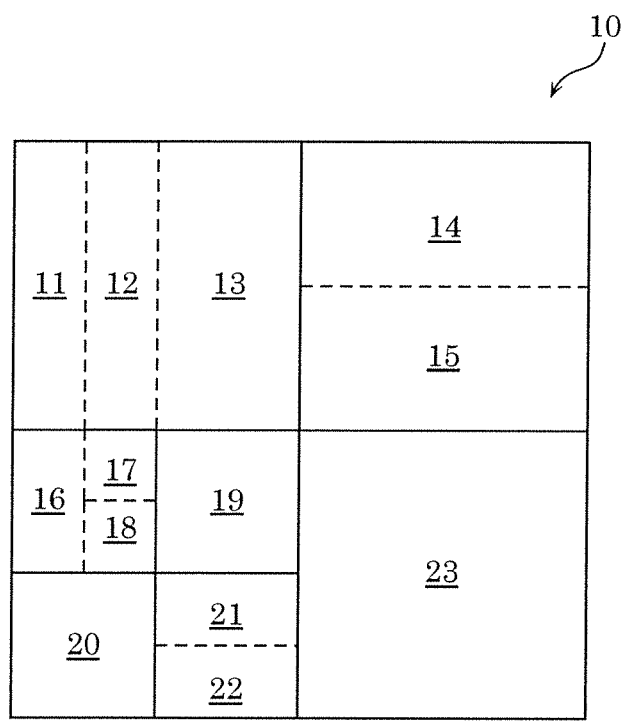
FIG. 2 illustrates one example of block splitting according to Embodiment 1.

FIG. 2 illustrates one example of block splitting according to Embodiment 1. In FIG. 2, the solid lines represent block boundaries of blocks split by quadtree block splitting, and the dashed lines represent block boundaries of blocks split by binary tree block splitting.

Here, block 10 is a square 128×128 pixel block (128×128 block). This 128×128 block 10 is first split into four square 64×64 blocks (quadtree block splitting).

The top left 64×64 block is further vertically split into two rectangle 32×64 blocks, and the left 32×64 block is further vertically split into two rectangle 16×64 blocks (binary tree block splitting). As a result, the top left 64×64 block is split into two 16×64 blocks 11 and 12 and one 32×64 block 13.

The top right 64×64 block is horizontally split into two rectangle 64×32 blocks 14 and 15 (binary tree block splitting).

The bottom left 64×64 block is first split into four square 32×32 blocks (quadtree block splitting). The top left block and the bottom right block among the four 32×32 blocks are further split. The top left 32×32 block is vertically split into two rectangle 16×32 blocks, and the right 16×32 block is further horizontally split into two 16×16 blocks (binary tree block splitting). The bottom right 32×32 block is horizontally split into two 32×16 blocks (binary tree block splitting). As a result, the bottom left 64×64 block is split into 16×32 block 16, two 16×16 blocks 17 and 18, two 32×32 blocks 19 and 20, and two 32×16 blocks 21 and 22.

The bottom right 64×64 block 23 is not split.

As described above, in FIG. 2, block 10 is split into 13 variable size blocks 11 through 23 based on recursive quadtree and binary tree block splitting. This type of splitting is also referred to as quadtree plus binary tree (QTBT) splitting.

Note that in FIG. 2, one block is split into four or two blocks (quadtree or binary tree block splitting), but splitting is not limited to this example. For example, one block may be split into three blocks (ternary block splitting). Splitting including such ternary block splitting is also referred to as multi-type tree (MBT) splitting.

(Subtractor)

Subtractor 104 subtracts a prediction signal (prediction sample) from an original signal (original sample) per block split by splitter 102. In other words, subtractor 104 calculates prediction errors (also referred to as residuals) of a block to be encoded (hereinafter referred to as a current block). Subtractor 104 then outputs the calculated prediction errors to transformer 106.

The original signal is a signal input into encoder 100, and is a signal representing an image for each picture included in a moving picture (for example, a luma signal and two chroma signals). Hereinafter, a signal representing an image is also referred to as a sample.

(Transformer)

Transformer 106 transforms spatial domain prediction errors into frequency domain transform coefficients, and outputs the transform coefficients to quantizer 108. More specifically, transformer 106 applies, for example, a predefined discrete cosine transform (DCT) or discrete sine transform (DST) to spatial domain prediction errors.

Note that transformer 106 may adaptively select a transform type from among a plurality of transform types, and transform prediction errors into transform coefficients by using a transform basis function corresponding to the selected transform type. This sort of transform is also referred to as explicit multiple core transform (EMT) or adaptive multiple transform (AMT).

The transform types include, for example, DCT-II, DCT-V, DCT-VIII, DST-I, and DST-VII. FIG. 3 is a chart indicating transform basis functions for each transform type. In FIG. 3, N indicates the number of input pixels. For example, selection of a transform type from among the plurality of transform types may depend on the prediction type (intra prediction and inter prediction), and may depend on intra prediction mode.

Information indicating whether to apply such EMT or AMT (referred to as, for example, an AMT flag) and information indicating the selected transform type is signalled at the CU level. Note that the signaling of such information need not be performed at the CU level, and may be performed at another level (for example, at the sequence level, picture level, slice level, tile level, or CTU level).

Moreover, transformer 106 may apply a secondary transform to the transform coefficients (transform result). Such a secondary transform is also referred to as adaptive secondary transform (AST) or non-separable secondary transform (NSST). For example, transformer 106 applies a secondary transform to each sub-block (for example, each 4×4 sub-block) included in the block of the transform coefficients corresponding to the intra prediction errors. Information indicating whether to apply NSST and information related to the transform matrix used in NSST are signalled at the CU level. Note that the signaling of such information need not be performed at the CU level, and may be performed at another level (for example, at the sequence level, picture level, slice level, tile level, or CTU level).

(Quantizer)

Quantizer 108 quantizes the transform coefficients output from transformer 106. More specifically, quantizer 108 scans, in a predetermined scanning order, the transform coefficients of the current block, and quantizes the scanned transform coefficients based on quantization parameters (QP) corresponding to the transform coefficients. Quantizer 108 then outputs the quantized transform coefficients (hereinafter referred to as quantized coefficients) of the current block to entropy encoder 110 and inverse quantizer 112.

A predetermined order is an order for quantizing/inverse quantizing transform coefficients. For example, a predetermined scanning order is defined as ascending order of frequency (from low to high frequency) or descending order of frequency (from high to low frequency).

A quantization parameter is a parameter defining a quantization step size (quantization width). For example, if the value of the quantization parameter increases, the quantization step size also increases. In other words, if the value of the quantization parameter increases, the quantization error increases.

(Entropy Encoder)

Entropy encoder 110 generates an encoded signal (encoded bitstream) by variable length encoding quantized coefficients, which are inputs from quantizer 108. More specifically, entropy encoder 110, for example, binarizes quantized coefficients and arithmetic encodes the binary signal.

(Inverse Quantizer)

Inverse quantizer 112 inverse quantizes quantized coefficients, which are inputs from quantizer 108. More specifically, inverse quantizer 112 inverse quantizes, in a predetermined scanning order, quantized coefficients of the current block. Inverse quantizer 112 then outputs the inverse quantized transform coefficients of the current block to inverse transformer 114.

(Inverse Transformer)

Inverse transformer 114 restores prediction errors by inverse transforming transform coefficients, which are inputs from inverse quantizer 112. More specifically, inverse transformer 114 restores the prediction errors of the current block by applying an inverse transform corresponding to the transform applied by transformer 106 on the transform coefficients. Inverse transformer 114 then outputs the restored prediction errors to adder 116.

Note that since information is lost in quantization, the restored prediction errors do not match the prediction errors calculated by subtractor 104. In other words, the restored prediction errors include quantization errors.

(Adder)

Adder 116 reconstructs the current block by summing prediction errors, which are inputs from inverse transformer 114, and prediction samples, which are inputs from prediction controller 128. Adder 116 then outputs the reconstructed block to block memory 118 and loop filter 120. A reconstructed block is also referred to as a local decoded block.

(Block Memory)

Block memory 118 is storage for storing blocks in a picture to be encoded (hereinafter referred to as a current picture) for reference in intra prediction. More specifically, block memory 118 stores reconstructed blocks output from adder 116.

(Loop Filter)

Loop filter 120 applies a loop filter to blocks reconstructed by adder 116, and outputs the filtered reconstructed blocks to frame memory 122. A loop filter is a filter used in an encoding loop (in-loop filter), and includes, for example, a deblocking filter (DF), a sample adaptive offset (SAO), and an adaptive loop filter (ALF).

In ALF, a least square error filter for removing compression artifacts is applied. For example, one filter from among a plurality of filters is selected for each 2×2 sub-block in the current block based on direction and activity of local gradients, and is applied.

More specifically, first, each sub-block (for example, each 2×2 sub-block) is categorized into one out of a plurality of classes (for example, 15 or 25 classes). The classification of the sub-block is based on gradient directionality and activity. For example, classification index C is derived based on gradient directionality D (for example, 0 to 2 or 0 to 4) and gradient activity A (for example, 0 to 4) (for example, $C=5D+A$). Then, based on classification index C, each sub-block is categorized into one out of a plurality of classes (for example, 15 or 25 classes).

For example, gradient directionality D is calculated by comparing gradients of a plurality of directions (for example, the horizontal, vertical, and two diagonal directions). Moreover, for example, gradient activity A is calculated by summing gradients of a plurality of directions and quantizing the sum.

The filter to be used for each sub-block is determined from among the plurality of filters based on the result of such categorization.

Figure 4A:
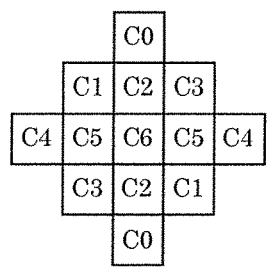
FIG. 4A illustrates one example of a filter shape used in ALF.
Figure 4B:
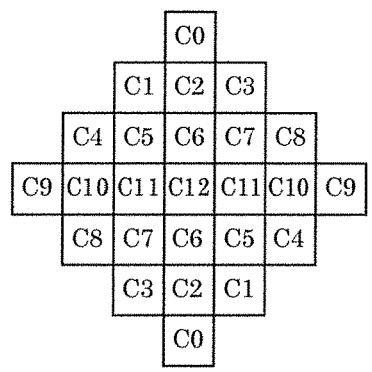
FIG. 4B illustrates another example of a filter shape used in ALF.
Figure 4C:
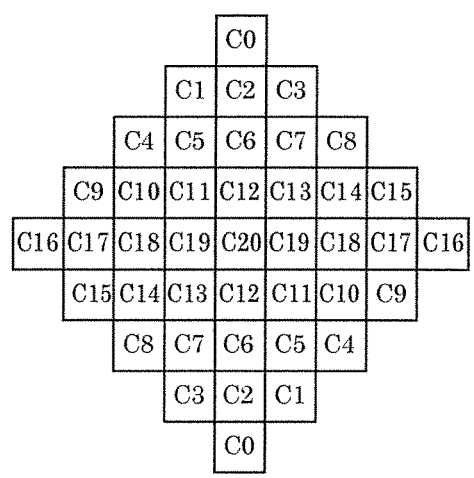
FIG. 4C illustrates another example of a filter shape used in ALF.

The filter shape to be used in ALF is, for example, a circular symmetric filter shape. FIG. 4A through FIG. 4C illustrate examples of filter shapes used in ALF. FIG. 4A illustrates a 5×5 diamond shape filter, FIG. 4B illustrates a 7×7 diamond shape filter, and FIG. 4C illustrates a 9×9 diamond shape filter. Information indicating the filter shape is signalled at the picture level. Note that the signaling of information indicating the filter shape need not be performed at the picture level, and may be performed at another level (for example, at the sequence level, slice level, tile level, CTU level, or CU level).

The enabling or disabling of ALF is determined at the picture level or CU level. For example, for luma, the decision to apply ALF or not is done at the CU level, and for chroma, the decision to apply ALF or not is done at the picture level. Information indicating whether ALF is enabled or disabled is signalled at the picture level or CU level. Note that the signaling of information indicating whether ALF is enabled or disabled need not be performed at the picture level or CU level, and may be performed at another level (for example, at the sequence level, slice level, tile level, or CTU level).

The coefficients set for the plurality of selectable filters (for example, 15 or 25 filters) is signalled at the picture level. Note that the signaling of the coefficients set need not be performed at the picture level, and may be performed at another level (for example, at the sequence level, slice level, tile level, CTU level, CU level, or sub-block level).

(Frame Memory)

Frame memory 122 is storage for storing reference pictures used in inter prediction, and is also referred to as a frame buffer. More specifically, frame memory 122 stores reconstructed blocks filtered by loop filter 120.

(Intra Predictor)

Intra predictor 124 generates a prediction signal (intra prediction signal) by intra predicting the current block with reference to a block or blocks in the current picture and stored in block memory 118 (also referred to as intra frame prediction). More specifically, intra predictor 124 generates an intra prediction signal by intra prediction with reference to samples (for example, luma and/or chroma values) of a block or blocks neighboring the current block, and then outputs the intra prediction signal to prediction controller 128.

For example, intra predictor 124 performs intra prediction by using one mode from among a plurality of predefined intra prediction modes. The intra prediction modes include one or more non-directional prediction modes and a plurality of directional prediction modes.

The one or more non-directional prediction modes include, for example, planar prediction mode and DC prediction mode defined in the H.265/high-efficiency video coding (HEVC) standard (see NPTL 1).

Figure 5:
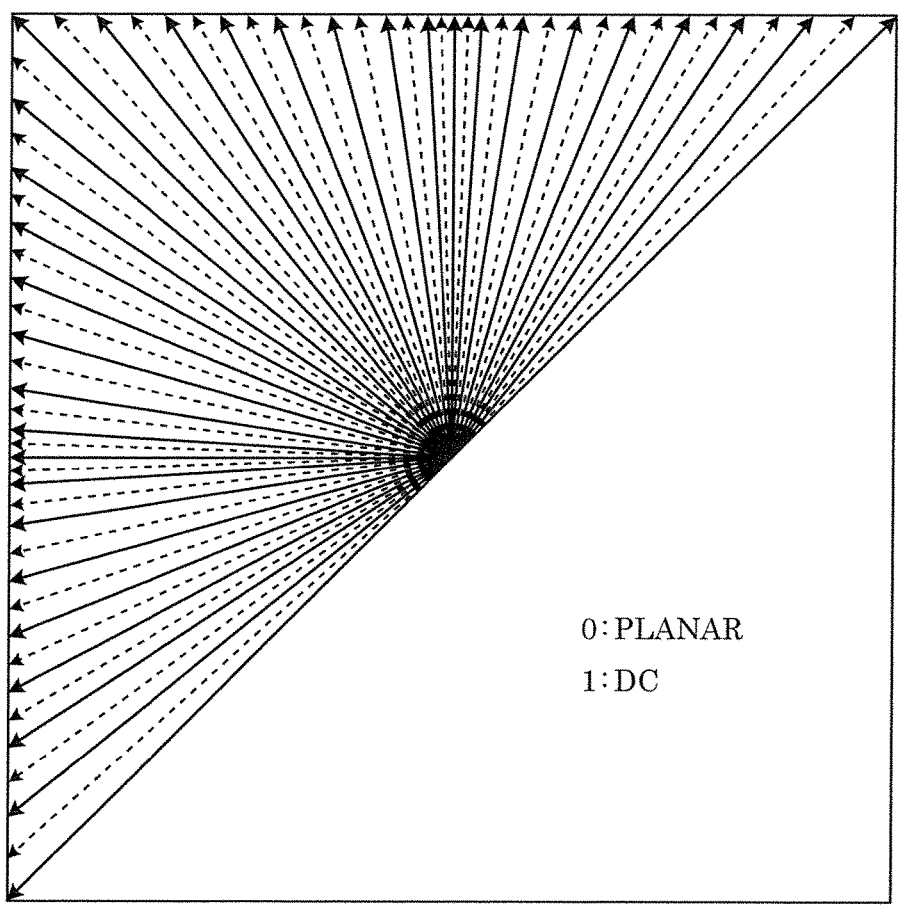
FIG. 5 illustrates 67 intra prediction modes used in intra prediction.

The plurality of directional prediction modes include, for example, the 33 directional prediction modes defined in the H.265/HEVC standard. Note that the plurality of directional prediction modes may further include 32 directional prediction modes in addition to the 33 directional prediction modes (for a total of 65 directional prediction modes). FIG. 5 illustrates 67 intra prediction modes used in intra prediction (two non-directional prediction modes and 65 directional prediction modes). The solid arrows represent the 33 directions defined in the H.265/HEVC standard, and the dashed arrows represent the additional 32 directions.

Note that a luma block may be referenced in chroma block intra prediction. In other words, a chroma component of the current block may be predicted based on a luma component of the current block. Such intra prediction is also referred to as cross-component linear model (CCLM) prediction. Such a chroma block intra prediction mode that references a luma block (referred to as, for example, CCLM mode) may be added as one of the chroma block intra prediction modes.

Intra predictor 124 may correct post-intra-prediction pixel values based on horizontal/vertical reference pixel gradients. Intra prediction accompanied by this sort of correcting is also referred to as position dependent intra prediction combination (PDPC). Information indicating whether to apply PDPC or not (referred to as, for example, a PDPC flag) is, for example, signalled at the CU level. Note that the signaling of this information need not be performed at the CU level, and may be performed at another level (for example, on the sequence level, picture level, slice level, tile level, or CTU level).

(Inter Predictor)

Inter predictor 126 generates a prediction signal (inter prediction signal) by inter predicting the current block with reference to a block or blocks in a reference picture, which is different from the current picture and is stored in frame memory 122 (also referred to as inter frame prediction). Inter prediction is performed per current block or per sub-block (for example, per 4×4 block) in the current block. For example, inter predictor 126 performs motion estimation in a reference picture for the current block or sub-block. Inter predictor 126 then generates an inter prediction signal of the current block or sub-block by motion compensation by using motion information (for example, a motion vector) obtained from motion estimation. Inter predictor 126 then outputs the generated inter prediction signal to prediction controller 128.

The motion information used in motion compensation is signalled. A motion vector predictor may be used for the signaling of the motion vector. In other words, the difference between the motion vector and the motion vector predictor may be signalled.

Note that the inter prediction signal may be generated using motion information for a neighboring block in addition to motion information for the current block obtained from motion estimation. More specifically, the inter prediction signal may be generated per sub-block in the current block by calculating a weighted sum of a prediction signal based on motion information obtained from motion estimation and a prediction signal based on motion information for a neighboring block. Such inter prediction (motion compensation) is also referred to as overlapped block motion compensation (OBMC).

In such an OBMC mode, information indicating sub-block size for OBMC (referred to as, for example, OBMC block size) is signalled at the sequence level. Moreover, information indicating whether to apply the OBMC mode or not (referred to as, for example, an OBMC flag) is signalled at the CU level. Note that the signaling of such information need not be performed at the sequence level and CU level, and may be performed at another level (for example, at the picture level, slice level, tile level, CTU level, or sub-block level).

Note that the motion information may be derived on the decoder side without being signalled. For example, a merge mode defined in the H.265/HEVC standard may be used. Moreover, for example, the motion information may be derived by performing motion estimation on the decoder side. In this case, motion estimation is performed without using the pixel values of the current block.

Here, a mode for performing motion estimation on the decoder side will be described. A mode for performing motion estimation on the decoder side is also referred to as pattern matched motion vector derivation (PMMVD) mode or frame rate up-conversion (FRUC) mode.

First, a candidate list (a candidate list may be a merge list) of candidates each including a motion vector predictor is generated with reference to motion vectors of encoded blocks that spatially or temporally neighbor the current block. Evaluation values for the candidates included in the candidate list are calculated and one candidate is selected based on the calculated evaluation values.

Next, a motion vector for the current block is derived from the motion vector of the selected candidate. More specifically, for example, the motion vector for the current block is calculated as the motion vector of the selected candidate, as-is. Alternatively, for example, the motion vector for the current block may be derived by pattern matching performed in the vicinity of a position in a reference picture corresponding to the motion vector of the selected candidate.

Note that an evaluation value is calculated by pattern matching performed between a region in a reference picture corresponding to a motion vector and a predetermined region.

The pattern matching used is either first pattern matching or second pattern matching. First pattern matching and second pattern matching are also referred to as bilateral matching and template matching, respectively.

In the first pattern matching, pattern matching is performed between two blocks along the motion trajectory of the current block in two different reference pictures. Therefore, in the first pattern matching, a region in another reference picture conforming to the motion trajectory of the current block is used as the predetermined region for the above-described calculation of the candidate evaluation value.

Figure 6:
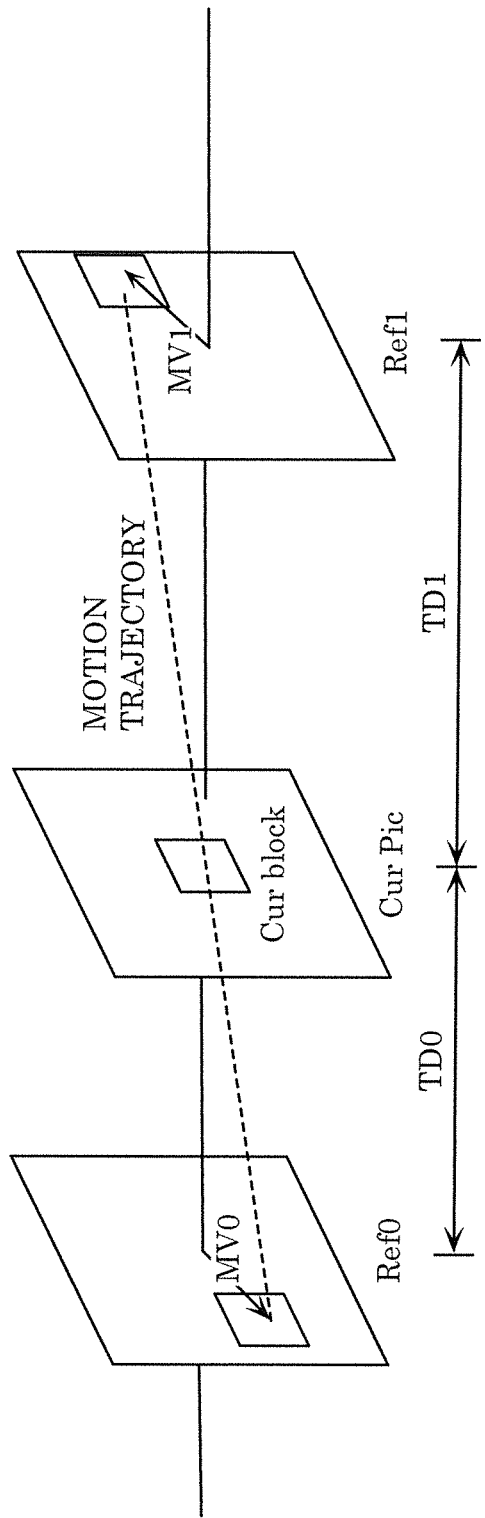
FIG. 6 is for illustrating pattern matching (bilateral matching) between two blocks along a motion trajectory.

FIG. 6 is for illustrating pattern matching (bilateral matching) between two blocks along a motion trajectory. As illustrated in FIG. 6, in the first pattern matching, two motion vectors (MV0, MV1) are derived by finding the best match between two blocks along the motion trajectory of the current block (Cur block) in two different reference pictures (Ref0, Ref1).

Under the assumption of continuous motion trajectory, the motion vectors (MV0, MV1) pointing to the two reference blocks shall be proportional to the temporal distances (TD0, TD1) between the current picture (Cur Pic) and the two reference pictures (Ref0, Ref1). For example, when the current picture is temporally between the two reference pictures and the temporal distance from the current picture to the two reference pictures is the same, the first pattern matching derives a mirror based bi-directional motion vector.

In the second pattern matching, pattern matching is performed between a template in the current picture (blocks neighboring the current block in the current picture (for example, the top and/or left neighboring blocks)) and a block in a reference picture. Therefore, in the second pattern matching, a block neighboring the current block in the current picture is used as the predetermined region for the above-described calculation of the candidate evaluation value.

Figure 7:
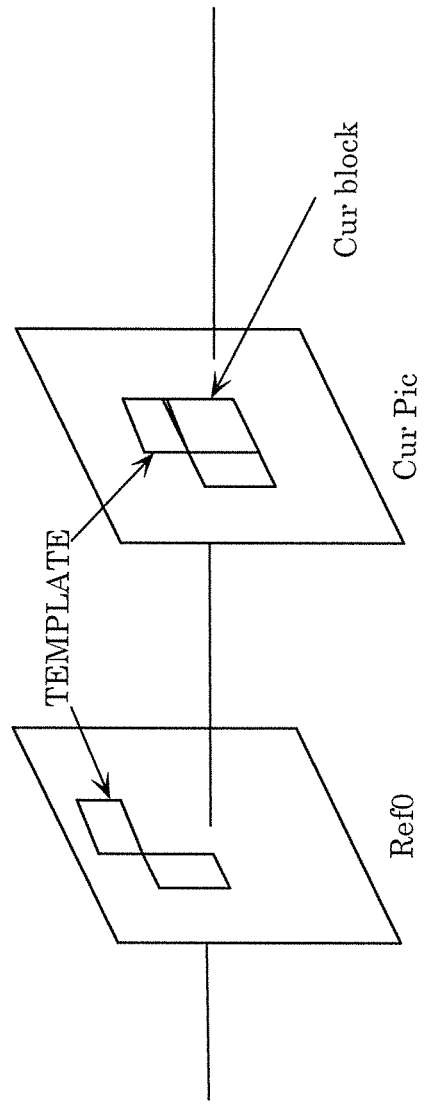
FIG. 7 is for illustrating pattern matching (template matching) between a template in the current picture and a block in a reference picture.

FIG. 7 is for illustrating pattern matching (template matching) between a template in the current picture and a block in a reference picture. As illustrated in FIG. 7, in the second pattern matching, a motion vector of the current block is derived by searching a reference picture (Ref0) to find the block that best matches neighboring blocks of the current block (Cur block) in the current picture (Cur Pic).

Information indicating whether to apply the FRUC mode or not (referred to as, for example, a FRUC flag) is signalled at the CU level. Moreover, when the FRUC mode is applied (for example, when the FRUC flag is set to true), information indicating the pattern matching method (first pattern matching or second pattern matching) is signalled at the CU level. Note that the signaling of such information need not be performed at the CU level, and may be performed at another level (for example, at the sequence level, picture level, slice level, tile level, CTU level, or sub-block level).

Note that motion information may be derived on the decoder side, using a method different from motion estimation. For example, the amount of correction of a motion vector may be calculated for each pixel using a peripheral pixel value, based on a model assuming uniform linear motion.

Here, a mode for deriving a motion vector based on a model assuming uniform linear motion will be described. This mode is also referred to as a bi-directional optical flow (BIO) mode.

Figure 8:
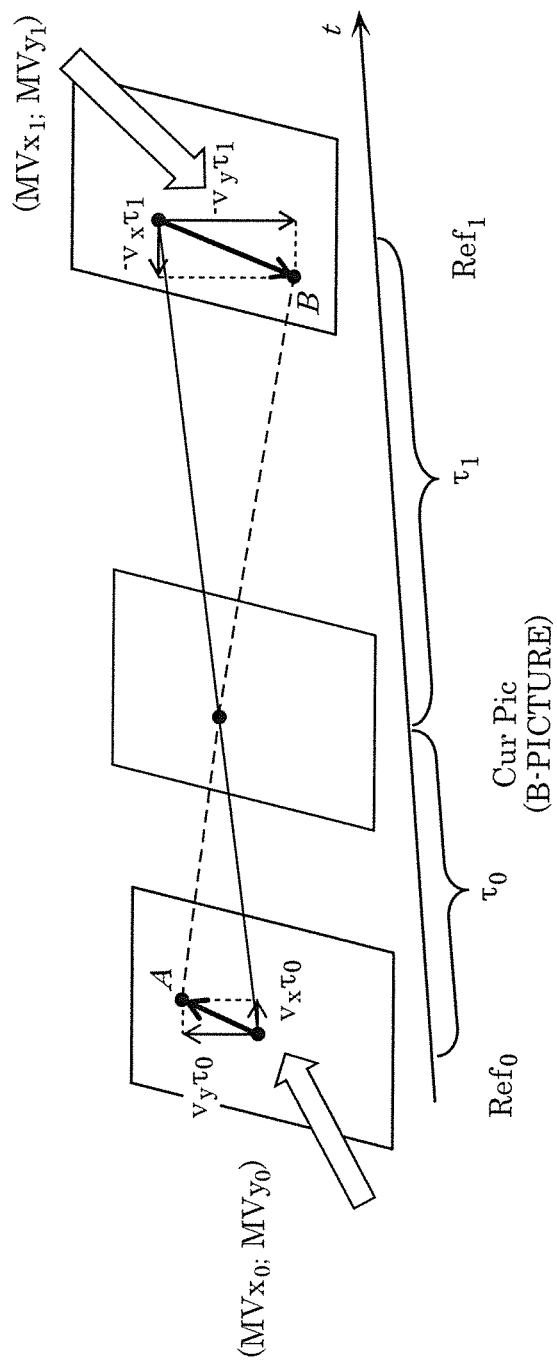
FIG. 8 is for illustrating a model assuming uniform linear motion.

FIG. 8 is for illustrating a model assuming uniform linear motion. In FIG. 8, $(v_x, v_y)$ denotes a velocity vector, and $\tau_0$ and $\tau_1$ denote temporal distances between the current picture (Cur Pic) and two reference pictures (Ref$_0$, Ref$_1$). (MVx$_0$, MVy$_0$) denotes a motion vector corresponding to reference picture Ref$_0$, and (MVx$_1$, MVy$_1$) denotes a motion vector corresponding to reference picture Ref$_1$.

Here, under the assumption of uniform linear motion exhibited by velocity vector $(v_x, v_y)$, (MVx$_0$, MVy$_0$) and (MVx$_1$, MVy$_1$) are represented as $(v_x\tau_0, v_y\tau_0)$ and $(-v_x\tau_1, -v_y\tau_1)$, respectively, and the following optical flow equation is given.

MATH. 1

$$\partial I^{(k)}/\partial t + v_x \partial I^{(k)}/\partial x + v_y \partial I^{(k)}/\partial y = 0. \quad (1)$$

Here, $I^{(k)}$ denotes a luma value from reference picture k (k=0, 1) after motion compensation. This optical flow equation shows that the sum of (i) the time derivative of the luma value, (ii) the product of the horizontal velocity and the horizontal component of the spatial gradient of a reference picture, and (iii) the product of the vertical velocity and the vertical component of the spatial gradient of a reference picture is equal to zero. A motion vector of each block obtained from, for example, a merge list is corrected pixel by pixel based on a combination of the optical flow equation and Hermite interpolation.

Note that a motion vector may be derived on the decoder side using a method other than deriving a motion vector based on a model assuming uniform linear motion. For example, a motion vector may be derived for each sub-block based on motion vectors of neighboring blocks.

Here, a mode in which a motion vector is derived for each sub-block based on motion vectors of neighboring blocks will be described. This mode is also referred to as affine motion compensation prediction mode.

Figure 9:
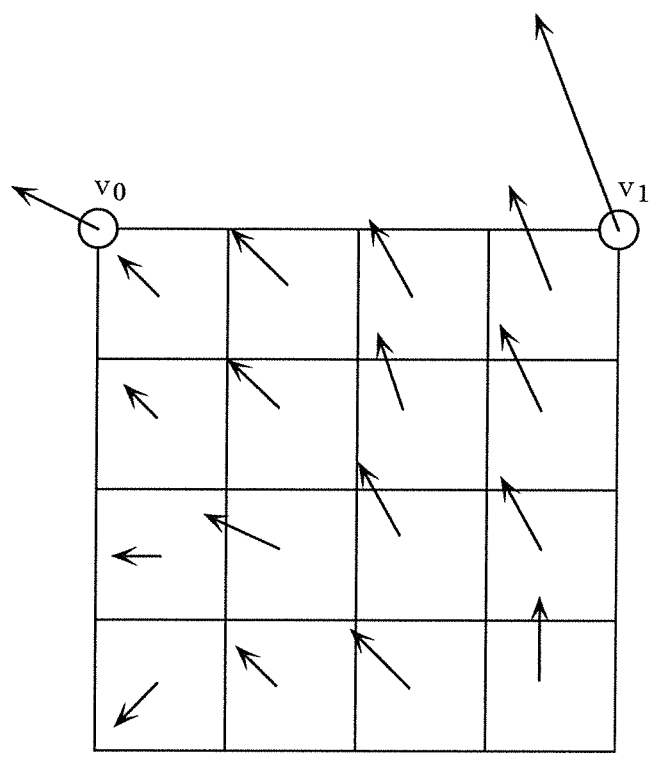
FIG. 9 is for illustrating deriving a motion vector of each sub-block based on motion vectors of neighboring blocks.

FIG. 9 is for illustrating deriving a motion vector of each sub-block based on motion vectors of neighboring blocks. In FIG. 9, the current block includes 16 4×4 sub-blocks. Here, motion vector $v_0$ of the top left corner control point in the current block is derived based on motion vectors of neighboring sub-blocks, and motion vector vi of the top right corner control point in the current block is derived based on motion vectors of neighboring blocks. Then, using the two motion vectors $v_0$ and vi, the motion vector $(v_x, v_y)$ of each sub-block in the current block is derived using Equation 2 below.

MATH. 2

$$\begin{cases} v_x = \frac{(v_{1x} - v_{0x})}{w}x - \frac{(v_{1y} - v_{0y})}{w}y + v_{0x} \\ v_y = \frac{(v_{1y} - v_{0y})}{w}x + \frac{(v_{1x} - v_{0x})}{w}y + v_{0y} \end{cases} \quad (2)$$

Here, x and y are the horizontal and vertical positions of the sub-block, respectively, and w is a predetermined weighted coefficient.

Such an affine motion compensation prediction mode may include a number of modes of different methods of deriving the motion vectors of the top left and top right corner control points. Information indicating such an affine motion compensation prediction mode (referred to as, for example, an affine flag) is signalled at the CU level. Note that the signaling of information indicating the affine motion compensation prediction mode need not be performed at the CU level, and may be performed at another level (for example, at the sequence level, picture level, slice level, tile level, CTU level, or sub-block level).

(Prediction Controller)

Prediction controller 128 selects either the intra prediction signal or the inter prediction signal, and outputs the selected prediction signal to subtractor 104 and adder 116.

(Decoder Outline)

Figure 10:
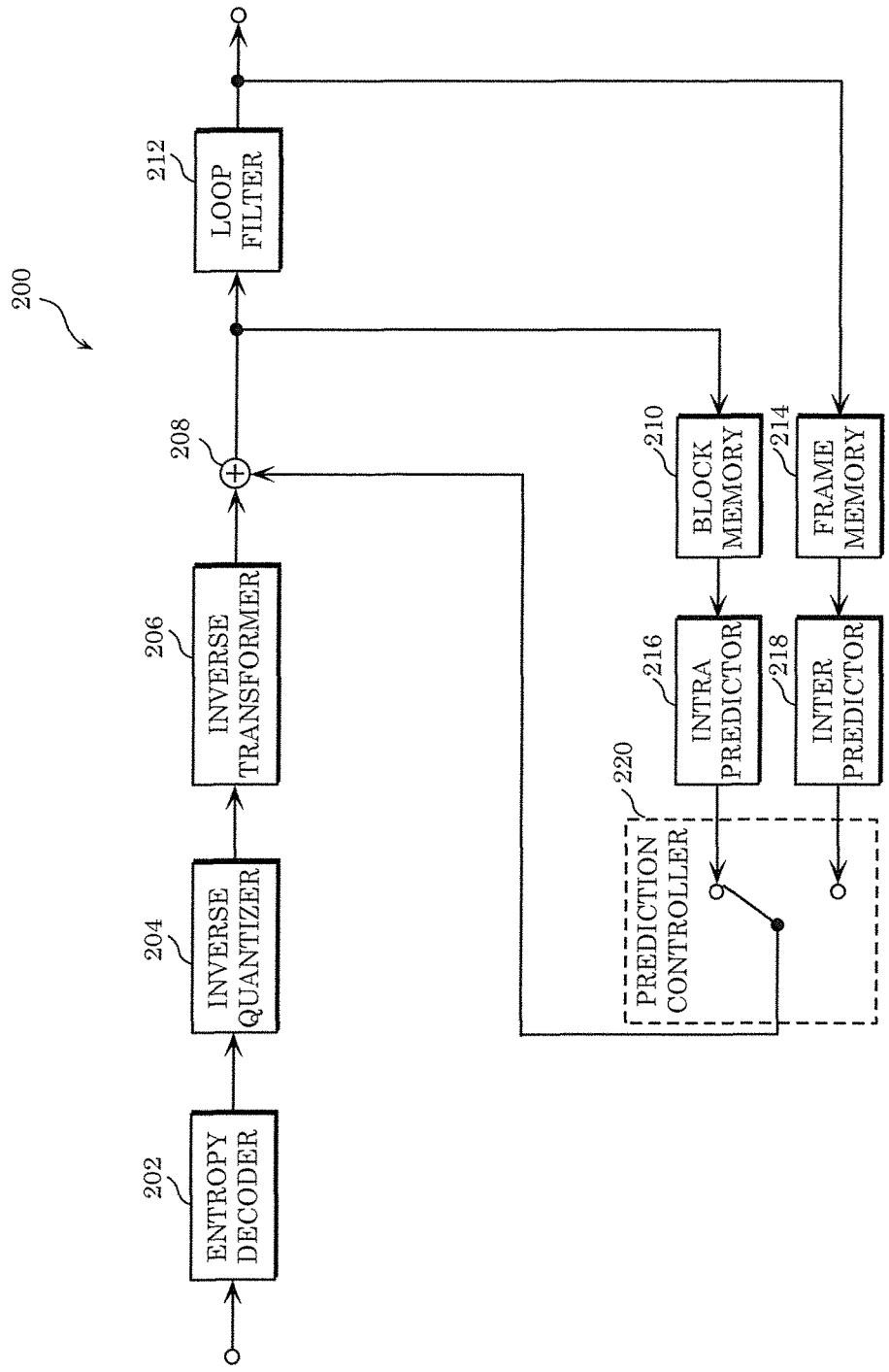
FIG. 10 is a block diagram illustrating a functional configuration of the decoder according to Embodiment 1.

Next, a decoder capable of decoding an encoded signal (encoded bitstream) output from encoder 100 will be described. FIG. 10 is a block diagram illustrating a functional configuration of decoder 200 according to Embodiment 1. Decoder 200 is a moving picture/picture decoder that decodes a moving picture/picture block by block.

As illustrated in FIG. 10, decoder 200 includes entropy decoder 202, inverse quantizer 204, inverse transformer 206, adder 208, block memory 210, loop filter 212, frame memory 214, intra predictor 216, inter predictor 218, and prediction controller 220.

Decoder 200 is realized as, for example, a generic processor and memory. In this case, when a software program stored in the memory is executed by the processor, the processor functions as entropy decoder 202, inverse quantizer 204, inverse transformer 206, adder 208, loop filter 212, intra predictor 216, inter predictor 218, and prediction controller 220. Alternatively, decoder 200 may be realized as one or more dedicated electronic circuits corresponding to entropy decoder 202, inverse quantizer 204, inverse transformer 206, adder 208, loop filter 212, intra predictor 216, inter predictor 218, and prediction controller 220.

Hereinafter, each component included in decoder 200 will be described.

(Entropy Decoder)

Entropy decoder 202 entropy decodes an encoded bitstream. More specifically, for example, entropy decoder 202 arithmetic decodes an encoded bitstream into a binary signal. Entropy decoder 202 then debinarizes the binary signal. With this, entropy decoder 202 outputs quantized coefficients of each block to inverse quantizer 204.

(Inverse Quantizer)

Inverse quantizer 204 inverse quantizes quantized coefficients of a block to be decoded (hereinafter referred to as a current block), which are inputs from entropy decoder 202. More specifically, inverse quantizer 204 inverse quantizes quantized coefficients of the current block based on quantization parameters corresponding to the quantized coefficients. Inverse quantizer 204 then outputs the inverse quantized coefficients (i.e., transform coefficients) of the current block to inverse transformer 206.

(Inverse Transformer)

Inverse transformer 206 restores prediction errors by inverse transforming transform coefficients, which are inputs from inverse quantizer 204.

For example, when information parsed from an encoded bitstream indicates application of EMT or AMT (for example, when the AMT flag is set to true), inverse transformer 206 inverse transforms the transform coefficients of the current block based on information indicating the parsed transform type.

Moreover, for example, when information parsed from an encoded bitstream indicates application of NSST, inverse transformer 206 applies a secondary inverse transform to the transform coefficients.

(Adder)

Adder 208 reconstructs the current block by summing prediction errors, which are inputs from inverse transformer 206, and prediction samples, which is an input from prediction controller 220. Adder 208 then outputs the reconstructed block to block memory 210 and loop filter 212.

(Block Memory)

Block memory 210 is storage for storing blocks in a picture to be decoded (hereinafter referred to as a current picture) for reference in intra prediction. More specifically, block memory 210 stores reconstructed blocks output from adder 208.

(Loop Filter)

Loop filter 212 applies a loop filter to blocks reconstructed by adder 208, and outputs the filtered reconstructed blocks to frame memory 214 and, for example, a display device.

When information indicating the enabling or disabling of ALF parsed from an encoded bitstream indicates enabled, one filter from among a plurality of filters is selected based on direction and activity of local gradients, and the selected filter is applied to the reconstructed block.

(Frame Memory)

Frame memory 214 is storage for storing reference pictures used in inter prediction, and is also referred to as a frame buffer. More specifically, frame memory 214 stores reconstructed blocks filtered by loop filter 212.

(Intra Predictor)

Intra predictor 216 generates a prediction signal (intra prediction signal) by intra prediction with reference to a block or blocks in the current picture and stored in block memory 210. More specifically, intra predictor 216 generates an intra prediction signal by intra prediction with reference to samples (for example, luma and/or chroma values) of a block or blocks neighboring the current block, and then outputs the intra prediction signal to prediction controller 220.

Note that when an intra prediction mode in which a chroma block is intra predicted from a luma block is selected, intra predictor 216 may predict the chroma component of the current block based on the luma component of the current block.

Moreover, when information indicating the application of PDPC is parsed from an encoded bitstream, intra predictor 216 corrects post-intra-prediction pixel values based on horizontal/vertical reference pixel gradients.

(Inter Predictor)

Inter predictor 218 predicts the current block with reference to a reference picture stored in frame memory 214. Inter prediction is performed per current block or per sub-block (for example, per 4×4 block) in the current block. For example, inter predictor 218 generates an inter prediction signal of the current block or sub-block by motion compensation by using motion information (for example, a motion vector) parsed from an encoded bitstream, and outputs the inter prediction signal to prediction controller 220.

Note that when the information parsed from the encoded bitstream indicates application of OBMC mode, inter predictor 218 generates the inter prediction signal using motion information for a neighboring block in addition to motion information for the current block obtained from motion estimation.

Moreover, when the information parsed from the encoded bitstream indicates application of FRUC mode, inter predictor 218 derives motion information by performing motion estimation in accordance with the pattern matching method (bilateral matching or template matching) parsed from the encoded bitstream. Inter predictor 218 then performs motion compensation using the derived motion information.

Moreover, when BIO mode is to be applied, inter predictor 218 derives a motion vector based on a model assuming uniform linear motion. Moreover, when the information parsed from the encoded bitstream indicates that affine motion compensation prediction mode is to be applied, inter predictor 218 derives a motion vector of each sub-block based on motion vectors of neighboring blocks.

(Prediction Controller)

Prediction controller 220 selects either the intra prediction signal or the inter prediction signal, and outputs the selected prediction signal to adder 208.

Embodiment 2

The following specifically describes a portion of processing performed in encoder 100 and decoder 200 having the configurations as described above, with reference to drawings. Note that it is apparent to a person skilled in the art that the embodiments below may be combined in order to yield more advantages of the present disclosure.

[Underlying Knowledge Forming Basis of Present Embodiment]

According to image compression encoding technology, generally, a picture (also referred to as a frame) included in an input video is once split into blocks which are quadrilateral regions so that the picture is encoded per block. Each block is encoded by intra prediction or inter prediction. Intra prediction is a prediction method for predicting a block using pixel values of encoded or decoded peripheral blocks, and inter prediction is a prediction method for predicting a block using an encoded or decoded picture. Furthermore, in compression encoding technology, each picture is encoded per block, using various parameters such as quantization parameters. These parameters are selected appropriately, whereby an amount of codes can be reduced and advantageous effects of improving image quality can be obtained.

On the other hand, such parameters also have an amount of codes, and thus a problem arises that an amount of codes for the entire picture conversely increases by optimizing parameters for each block. On the other hand, when a common parameter is used for the entire picture, the same parameter is used for various characteristics of blocks included in the picture, and thus it is difficult to optimize a parameter for each portion. In view of this, considering a fact that all the blocks in a picture do not necessarily have different characteristics, a method for collectively defining parameters for plural blocks having similar characteristics can be proposed. According to this method, plural sets each including plural types of parameters are defined in advance, and only a number for identifying one of the sets is assigned to each block. This avoids defining many parameters for each block, and thus an increase in the amount of codes can be prohibited.

Specifically, the encoder first splits a picture into plural blocks. For example, the encoder once splits a picture into blocks each having a 128×128 pixel size. The encoder further splits one or more of the blocks having a 128×128 pixel size if necessary. If such a block is split, the encoder encodes a flag indicating that the block is split, and splits the block having a 128×128 pixel size into four blocks having a 64×64 pixel size. The encoder determines, for each of the four blocks having a 64×64 pixel size, whether to further split the block, and encodes a flag indicating whether the block is split. In this manner, the encoder recursively repeats split until the block size reaches the minimum size, as necessary. The minimum size of a block is an 8×8 pixel size, for example. Accordingly, one picture includes plural blocks having sizes in a range from a 128×128 pixel size to an 8×8 pixel size.

The encoder performs subsequent encoding processing on each of plural blocks obtained by splitting a picture as described above. In the subsequent encoding processing, the encoder generates a predicted image of a block by intra prediction or inter prediction, derives a difference between the block and the predicted image, and converts the difference into information on a frequency domain, using orthogonal transform such as discrete cosine transform (DCT) and discrete sine transform (DST), for example. Then, the encoder quantizes the information in consideration of visual characteristics. The quantized information generally has a small value. Accordingly, the encoder encodes the information by variable length coding. This achieves reduction in the amount of codes. Quantization generates a difference between an input image and an image restored based on the encoded information. In other words, lossy compression is performed by quantization. However, due to human visual characteristics, a person does not readily identify such a difference as mentioned above in an image greatly different from the previous image generally due to, for instance, change of scenes or in a portion of an image in which fast motion is made. Accordingly, the amount of codes can be greatly reduced by increasing the quantization width (or in other words, coarsely encoding). For each block, a flag which indicates whether to use intra prediction or inter prediction, a prediction direction when intra prediction is used, motion information and a reference image when inter prediction is used, a quantization parameter for determining the level of quantization when quantization is to be performed, and parameters such as context information when variable length coding (specifically CABAC: Context-Based Adaptive Binary Arithmetic Coding) is performed are also encoded. Specifically, various parameters are related for each block, and these parameters are also encoded.

Here, optimal values of such parameters are different for each of plural blocks in a picture. However, for example, when there is a comparatively large object captured over plural blocks in a picture, the blocks included in the area of the object have similar characteristics. Accordingly, parameters having the same or similar values are applied to the blocks included in the area of the object, whereby it can be expected that the blocks are efficiently encoded. Accordingly, collectively defining plural parameters related to encoding these blocks eliminates the necessity of transmitting the same code for each block, and achieves reduction in the amount of codes. On the other hand, when relevance of parameters for plural blocks is low, parameters are defined for each block, rather than collectively defining parameters for the blocks. Accordingly, an image can be appropriately encoded also when relevance of parameters for plural blocks is low.

In the latest image compression technology, an image is encoded using context adaptive binary arithmetic coding (CABAC). According to the CABAC, a signal to be encoded is binarized, and thereafter optimal probability information is selected using characteristics of an image and information on encoded or decoded peripheral blocks, thus performing arithmetic coding. In the arithmetic coding, to a signal (value) for which high probability is expected, the expected probability is applied, and a code suitable for a probability which a sequence of successive signals has is assigned. Accordingly, information subjected to arithmetic coding can be compressed to the amount of codes close to a theoretical limit.

The VP9 compression technology (also simply referred to as VP9) which Google Inc. has proposed is a method for collectively defining plural types of parameters for each block. In VP9 compression technology, a relation between the type of a block and parameters is defined first. Specifically, plural types of parameters used for encoding are defined for each number indicated by segment_id which is information for identifying the type of a block, in a portion corresponding to a picture header. Plural types of parameters used for encoding are flags indicating whether to omit encoding: a quantization parameter; a filtering strength of an in-loop filter; an index number for selecting a reference picture; and residual data (also referred to as a prediction error). The encoder encodes only segment_id for each block and uses parameters identified by segment_id to encode the block, thus achieving reduction in the amount of codes for each block.

Figure 11:
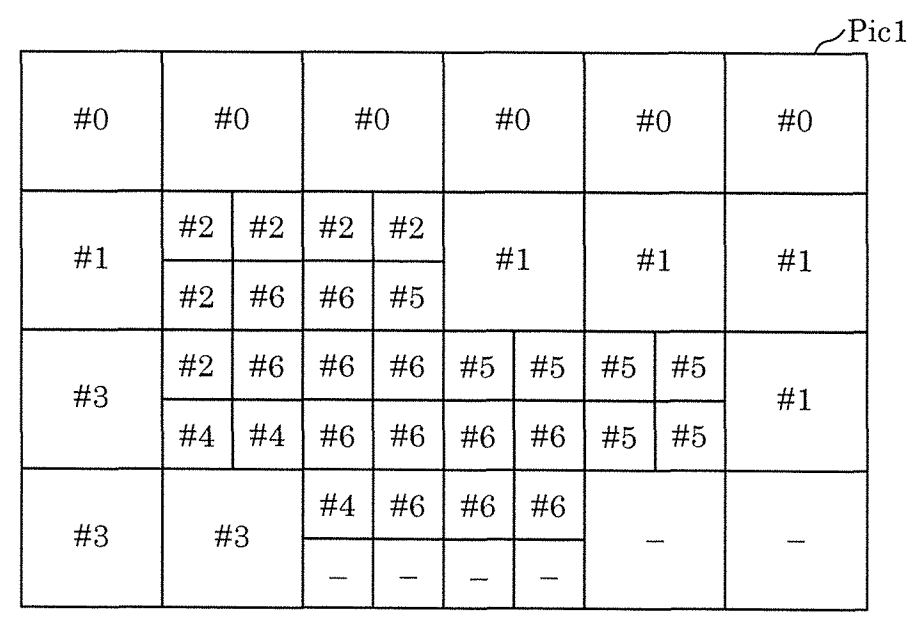

FIG. 11 illustrates examples of segment_ids given to blocks of a picture. As illustrated in FIG. 11, picture Pic1 is encoded per 64×64 pixel block (referred to as a superblock), for example. A 64×64 pixel block can be split. As illustrated in FIG. 11, a portion of picture Pic1 from the center toward the bottom is encoded per 32×32 pixel block. The encoder recursively splits a 64×64 pixel block so that plural blocks having sizes from the 64×64 pixel size to the 4×4 pixel size can be included in one picture.

Here, segment_id is given to each block. Plural types of parameters associated with segment_id given to each block are defined in a picture header. A set which includes a maximum of eight parameters can be defined using segment_id.

FIG. 12 illustrates examples of sets of parameters associated with numbers indicated by segment_ids.

A set of parameters which include QP (quantization parameter), LFlevel (filter level), REFpicture (reference picture), and SKIP (skip mode) is defined for each number indicated by segment_id (in other words, a number among #0 to #6). When segment_id is used, the encoder defines the number of segment_id for a block. Accordingly, defining QP, LFlevel, REFpicture, and SKIP for the block can be omitted.

The VP9 compression technology has proposed collectively defining four parameters which include QP, LFlevel, REFpicture, and SKIP, using segment_id as mentioned above. However, the included parameters are not limited to such four parameters, and there are other conceivable parameters expected to improve compression efficiency. For example, a parameter which indicates switching between intra prediction and inter prediction, a parameter which indicates the number of reference pictures, and a parameter which indicates the precision of a motion vector are conceivable parameters. If the number of parameters collectively defined using segment_id is decreased, improvement in encoding efficiency decreases, whereas if the number of parameters defined using segment_id is increased, adjustment of parameters for each block becomes difficult. Further, it is conceivable to adjust, for each picture or sequence, the types and the number of parameters defined using segment_id, for instance, yet complexity increases in terms of optimization.

Here, in the latest compression technology, context adaptive binary arithmetic coding (CABAC) which is excellent in encoding efficiency is used to encode a block included in a picture. CABAC is variable length coding technology which can achieve encoding efficiency close to a statistical limit, by adjusting probability information of a signal to be encoded. It is anticipated that probability information is different for I pictures, P pictures, and B pictures, and thus in high-efficiency video coding (HEVC) technology, probability information is greatly different for I pictures, P pictures, and B pictures. Furthermore, it is expected that neighboring blocks tend to have similar probability information. Accordingly, the encoder switches between probability information, also using parameters obtained by encoding peripheral blocks. Accordingly, a current block is encoded based on probability information more suitable for the block, and thus high encoding efficiency can be obtained. A context index is used to switch between probability information. Specifically, the encoder and the decoder each perform encoding processing and decoding processing, using probability information stored in a probability information table and identified by a context index. If probability information stored in the probability information table matches occurrence frequency in actual encoding, that is, probability, encoding efficiency matches the limit according to the information theory. This allows an image to be encoded using the smallest amount of codes.

Occurrence frequency changes in encoding. Accordingly, in CABAC processing, each time a parameter is encoded, the encoder updates probability information for the parameter. The encoder and the decoder each perform the same processing to update probability information, and thus both perform encoding and decoding using the same probability information. In this manner, in CABAC, by updating probability information, the probability information further approximates to the actual probability of a parameter for a block, and thus encoding efficiency improves.

Probability information used in CABAC is initialized in a first portion of a picture, for example. In the case of HEVC, a default initial value is applied to probability information in a first portion of a slice or a tile. Such initial values are different for an I picture, a P picture, and a B picture, yet features of an image themselves are not reflected on the values. In the case of VP9 in which probability information is initialized per picture, it is possible to adjust the initial value of probability information itself, which is different from HEVC, yet the initial value itself cannot be changed for each block. Accordingly, probability information different for each block, that is, probability information more suitable for each block is applied in a picture, and thus it can be expected to obtain higher encoding efficiency.

In order to solve the above problem, the present disclosure predefines parameters for segment_ids. Probability information for encoding or decoding a block is included in plural types of parameters defined for segment_id, and probability information is switched according to segment_id.

Accordingly, probability information suitable for characteristics of a block is applied, and thus the amount of codes can be expected to be reduced in encoding (decoding) all the parameters using probability information.

Outline of the Present Embodiment

Encoder 100 according to the present embodiment includes processing circuitry and a memory coupled to the processing circuitry. The memory includes, for example, block memory 118 and frame memory 122 illustrated in FIG. 1. The processing circuitry includes at least one element other than the memory, among the elements illustrated in FIG. 1. For example, the processing circuitry includes a processor, a central processing unit (CPU), or an integrated circuit.

Such processing circuitry performs the following processing using the memory. Specifically, the processing circuitry defines at least one parameter for each of plural types of segment identification information for identifying plural block types. Segment identification information is segment_id described above. Next, the processing circuitry splits an image into blocks. The processing circuitry assigns, to each of the blocks, segment_id according to a type of the block, among the plural types of segment_ids.

Figure 13:
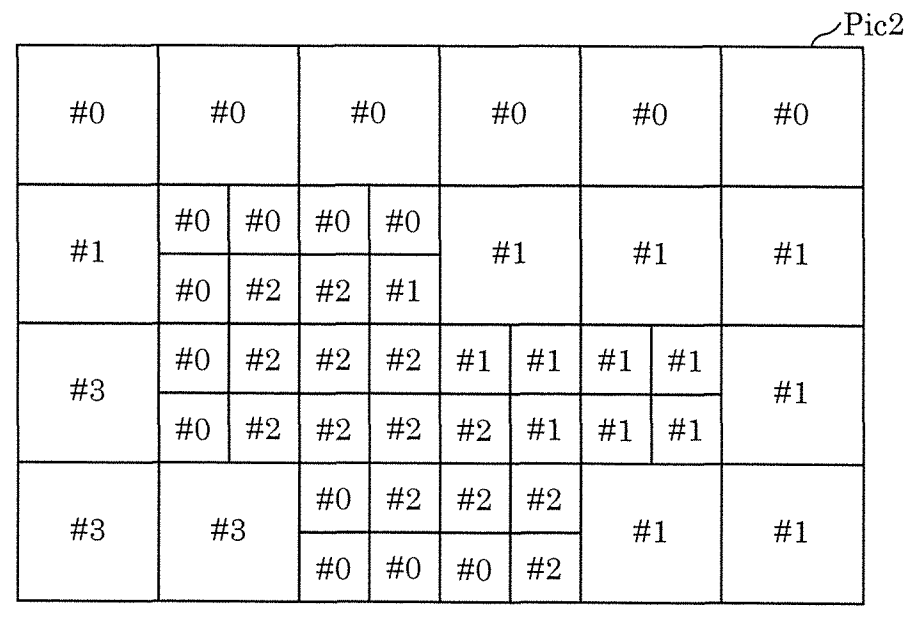

FIG. 13 illustrates examples of segment_ids assigned to blocks of a picture.

As illustrated in FIG. 13, picture Pic2 includes plural square blocks. For example, one or more of the blocks each include 64×64 pixel luma blocks. A 64×64 pixel block is referred to as a superblock. Typically, in the case of a 4:2:0 color signal, a superblock includes a 64×64 pixel luma block, a 32×32 pixel blue chroma block, and a 32×32 pixel red chroma block. In the present embodiment, similar processing to the processing on a luma block is performed on a chroma block corresponding to a luma block. Specifically, the encoder according to the present embodiment splits, for example, a chroma block similarly to a luma block, except that the number of pixels of a chroma block is one half of that of a luma block. Accordingly, the following describes, for instance, processing by the encoder in the present embodiment using a luma block, and omits a detailed description of a chroma block. In the following description, a luma block is simply referred to as a block.

Next, the processing circuitry sequentially encodes the blocks. When the blocks are to be encoded, the processing circuitry first identifies segment_id assigned to a current block to be encoded among the blocks. Then, the processing circuitry encodes the current block, using at least one parameter defined for identified segment_id. Here, in the present embodiment, the at least one parameter includes a parameter for identifying probability information associated with context used in context-based adaptive binary arithmetic coding (CABAC). The parameter for identifying the probability information is seg_context_idx later described.

Decoder 200 according to the present embodiment includes processing circuitry and a memory coupled to the processing circuitry. The memory includes block memory 210 and frame memory 214 illustrated in FIG. 10, for example. The processing circuitry includes at least one element other than the memory, among the elements illustrated in FIG. 10. For example, the processing circuitry includes a processor, a central processing unit (CPU), or an integrated circuit, for instance.

The processing circuitry included in decoder 200 performs the following processing using the memory. Specifically, the processing circuitry decodes at least one parameter defined for each of plural types of segment identification information for identifying plural block types. Segment identification information is segment_id described above. Next, the processing circuitry identifies blocks included in an image. The processing circuitry decodes segment_ids assigned for the blocks, and sequentially decodes the blocks. In decoding the blocks, the processing circuitry first identifies segment_id assigned to a current block to be decoded among the blocks. The processing circuitry decodes the current block, using at least one parameter defined for identified segment_id. Here, in the present embodiment, the at least one parameter includes a parameter for identifying probability information associated with context used in context-based adaptive binary arithmetic coding (CABAC). The parameter for identifying probability information is seg_context_idx later described.

As described above, in the present embodiment, parameters including seg_context_idx are defined for each of plural types of segment_id, and to each block, segment_id according to the type (namely, characteristics) of the block is assigned. Thus, it is not necessary, for each of blocks, to encode information for identifying probability information suitable for the block, and thus encoding efficiency can be improved.

[Defining Parameters]

First, segment_id and defining parameters for that segment_id are to be described. In defining parameters for segment_id, parameters may be defined irrespective of the size of a block. However, an optimal parameter may be often different depending on the size of a block. Accordingly, in the present embodiment, parameters are defined for a combination of segment_id and a depth which is size identification information indicating the size of a block obtained as a result of split. In the present embodiment, for example, splitter 102 included in encoder 100 defines parameters for each combination. Splitter 102 defines parameters for each picture or each image larger than a picture such as a sequence or a video layer, for example. Specifically, parameters for a combination are defined in a header or a parameter set in a picture, a sequence, or a video layer. For example, parameters are defined in a picture parameter set.

FIG. 14 illustrates an example of syntax for defining parameters in a picture parameter set. In the syntax illustrated in FIG. 14, segment_num indicates the number of a block type associated with a depth. In the case of VP9, the block type is not distinguished for each depth, and a total number of block types is 8. Note that the block type is identified by segment_id. The number of block types may be fixed or may be defined in an upper layer, that is, a video layer, for example. The number may be an arbitrary number, yet may be a power of 2, such as 4, 8, or 16.

FIG. 15 illustrates examples of parameters for combinations of depth and segment_id defined in a picture parameter set. depth=0 indicates that a block is not split, or in other words, a block has a 64×64 pixel size. For example, splitter 102 defines parameters for each of combinations of depth=0 and four block types identified by segment_id=#0, #1, #2, and #3. Specifically, for example, four sets each including five parameters are defined for blocks having a 64×64 pixel size. Examples of the parameters include inter_intra, seg_QP, seg_REFPIC, seg_SKIP, and seg_context_idx. inter_intra is a parameter indicating that a prediction method is inter prediction or intra prediction. inter_intra=0 indicates intra prediction, and inter_intra=1 indicates inter prediction. seg_QP is a quantization parameter. seg_REFPIC is a parameter indicating a reference picture, that is, a reference picture index. seg_SKIP is a parameter indicating whether the encoding method is a skip mode. seg_SKIP=0 indicates that the encoding method is not a skip mode, whereas seg_SKIP=1 indicates that the encoding method is a skip mode. seg_context_idx is a parameter for identifying probability information associated with context used in CABAC. Note that when encoding a picture starts, seg_context_idx is used to identify an initial value of the probability information.

For example, splitter 102 defines, for example, inter_intra=1, seg_QP=13, seg_REFPIC=0, and seg_context_idx=#0-0, for a combination of depth=0 and segment_id=#0, according to syntax illustrated in FIG. 14.

Note that information indicating parameters defined for each of combinations of depth and segment_id as in the examples illustrated in FIG. 15 is hereinafter referred to as definition information. The definition information is included in a picture parameter set.

Entropy encoder 110 encodes inter_intra=1, seg_QP=13, seg_REFPIC=0, and seg_context_idx=#0-0, if parameters are defined based on syntax as in the above examples. Specifically, entropy encoder 110 encodes 1, 13, 0, 0, and #0-0 defined for the above combination. Subsequently, encoder 100 similarly encodes parameters defined for other combinations of depth and segment_id, whereby all the parameters illustrated in FIG. 15, that is, definition information is encoded.

Note that encoder 100 does not need to encode all parameters corresponding to the combinations, and defining and encoding one or more of the parameters may be omitted. For example, in the case of seg_SKIP=1, encoder 100 can omit necessary codes for defining other parameters such as inter_intra. If necessary codes are omitted, the amount of codes can be reduced. In the case of seg_SKIP=1, the values of other parameters are not updated, and thus previous values or default values are maintained and used as values of other parameters to decode a block for which seg_SKIP=1 is defined.

Encoder 100 may use "explicit" as the value of a parameter or a code. When a parameter indicates "explicit", the actual value of or a code for the parameter is defined for a block. For example, inter_intra which is a parameter indicates one of 0, 1, and 2. As mentioned above, inter_intra=0 indicates that the prediction method is intra prediction, whereas inter_intra=1 indicates that the prediction method is inter prediction. Further, inter_intra=2 indicates that the prediction method is "explicit". If the prediction method is "explicit", splitter 102 defines a prediction method (intra prediction or inter prediction) for a block for which inter_intra=2 is defined. Thus, if "explicit" is used, the amount of codes cannot be reduced, yet a parameter can be adaptively adjusted according to a block.

Encoder 100 according to the present embodiment includes at least one parameter defined for each of plural types of segment_ids as described above, in a picture parameter set, for example. In splitting an image, encoder 100 splits a picture which is the image. Accordingly, encoder 100 can encode each picture using parameters suitable for blocks included in the picture.

In defining at least one parameter described above, encoder 100 defines at least one parameter for a combination of one of plural types of segment_ids and one of plural types of depths for identifying block sizes. In encoding a current block, encoder 100 encodes the current block, using at least one parameter defined for a combination of identified segment_id and a depth according to a size of the current block. Accordingly, a suitable parameter according to the size and the type of a block can be used to encode the block, and thus encoding efficiency can be improved.

Decoder 200 according to the present embodiment extracts from, for example, a picture parameter set and decodes at least one parameter defined for each of plural types of segment_ids. In identifying plural blocks, decoder 200 identifies plural blocks included in a picture which is an image. Accordingly, decoder 200 can decode each picture, using parameters suitable for blocks included in the picture.

Decoder 200 identifies at least one parameter defined for a combination of one of plural types of segment_ids and one of plural types of depths for identifying block sizes. In decoding a current block to be decoded, decoder 200 decodes the current block using at least one parameter defined for a combination of identified segment_id and a depth according to a size of the current block. Accordingly, decoder 200 can use a suitable parameter according to the size and the type of a block to decode the block, thus improving encoding efficiency.

[Block Splitting and Assignment of Segment_Id]

Next, block splitting in a picture and a method for assigning segment_ids to the split blocks are described.

FIG. 16A illustrates an example of syntax for block splitting and assigning segment_ids to blocks.

First, splitter 102 splits a picture into quadrilateral regions. For example, splitter 102 splits, into plural superblocks which are 64×64 pixel quadrilateral regions, picture Pic2 which includes 384×256 pixels illustrated in FIG. 13. As a result, picture Pic2 is split into a total of 24 superblocks disposed in six columns aligned widthwise and four rows aligned lengthwise. Splitter 102 sequentially scans superblocks, from the top leftmost superblock in picture Pic2 to the right. When a superblock to be scanned comes to a rightmost block, splitter 102 sequentially scans superblocks, from the leftmost superblock in a row directly below the previous row to the right. In this manner, splitter 102 sequentially scans the 24 superblocks.

Specifically, in the example illustrated in FIG. 13, splitter 102 does not split superblocks in the first row from the top in picture Pic2 (in other words, the top row). Splitter 102 splits the second leftmost superblock and the third leftmost superblock in the second row from the top in picture Pic2. Similarly, splitter 102 scans the superblocks in the third row, splits superblocks which need to be split. Subsequently, splitter 102 scans the superblocks in the fourth row, and splits superblocks which are to be split.

Next, splitter 102 assigns segment_id to each block. For example, splitter 102 assigns segment_id=#0 to all the superblocks in the top row in picture Pic2, and assigns segment_id=#1 to a leftmost superblock in the second row from the top. Next, splitter 102 assigns segment_ids to four subblocks obtained by splitting the second leftmost superblock in the second row from the top. Specifically, splitter 102 assigns segment_id=#0, #0, #0, and #2 to the upper left subblock, the upper right subblock, the lower left subblock, and the lower right subblock, respectively, among the four subblocks.

More specifically, if the procedure indicated by the syntax illustrated in FIG. 16A is used in the above case, the top leftmost superblock in picture Pic2 is not split, and thus splitter 102 obtains split_block=0 which is a flag indicating that the superblock is not split. At this time, conditions of the if statement in the syntax are not satisfied, and thus splitter 102 assigns segment_id=#0 to the superblock.

FIG. 16B illustrates examples of block_partition and segment_ids of blocks.

Processing indicated by the syntax illustrated in FIG. 16A is repeated sequentially for superblocks, whereby a superblock among the superblocks included in picture Pic2 is split into plural subblocks, as illustrated in FIG. 13. Then, segment_ids are assigned to the blocks including superblocks. Specifically, the above processing indicated by the syntax is repeated for superblocks from the upper left to the lower right in picture Pic2, so that block splitting is performed in the entire picture and segment_ids for blocks are assigned. As illustrated in FIG. 16B, block_partition which is block split information indicating a split pattern of a picture is obtained by splitting the entire picture into blocks. Entropy encoder 110 may encode information such as segment_id and block_partition, using typical variable length coding such as Huffman coding. Alternatively, entropy encoder 110 may encode information described above, using context-based adaptive variable length coding (CAVLC) which is context adaptive coding performed in consideration of peripheral blocks or CABAC, for instance. Adjacent blocks tend to show similar characteristics, and thus context adaptive coding may be used. Accordingly, in the present embodiment, entropy encoder 110 encodes block split information (specifically, block_partition) which indicates a split pattern of an image. Accordingly, decoder 200 can be suitably notified of the pattern of split performed by encoder 100.

Here, in order to simplify the description, an example of split of only a one-level hierarchy has been described, yet as illustrated in the syntax in FIG. 16A, a block can be split hierarchically, and segment_id can be assigned hierarchically. Thus, not only a 64×64 pixel block and a 32×32 pixel block, but also a 16×16 pixel block or an 8×8 pixel block can be included in a picture. If it is known that a picture is not split into blocks having a size smaller than a predetermined size, max_depth which is a parameter may define in advance the upper limit of a hierarchy of split. In this case, a code for split_block which indicates whether to further split a block can also be omitted. For example, if a block is not split into blocks having a size the same as the 16×16 pixel size or smaller, splitter 102 can decrease the amount of codes for a code for split_block, by predefining max_depth=2.

Decoder 200 decodes codes for segment_id and block_partition described above, for instance. Accordingly, a block split pattern can be determined, and segment_ids assigned to blocks can be obtained. Thus, in the present embodiment, entropy decoder 202 in decoder 200 decodes block split information which indicates a split pattern of a picture (specifically, block_partition). Entropy decoder 202 identifies plural blocks included in the image, based on the block split information. For example, entropy decoder 202 decodes block_partition=0 for the top leftmost block in picture Pic2 illustrated in FIG. 13. Accordingly, the block is not split. Decoder 200 thus can identify that the size of the block is a 64×64 pixel size, and a depth associated with the block is "0".

FIG. 17 illustrates an example of syntax for obtaining parameters to be applied to blocks.

In the above example, a depth of the top leftmost block is "0". Further, segment_id=#0 is assigned to the block. Here, according to definition information illustrated in FIG. 15, parameters are defined for a combination of depth=0 and segment_id=#0. Specifically, the parameters are inter_intra=1, seg_QP=13, seg_REFPIC=0, seg_SKIP=0, and seg_context_idx=#0-0. The parameters are associated with the combination of depth=0 and segment_id=#0 in the definition information. Thus, entropy encoder 110 in encoder 100 can obtain, from the definition information illustrated in FIG. 15, parameters defined for the combination, according to, for example, the syntax illustrated in FIG. 17. Similarly, entropy decoder 202 in decoder 200 can obtain, from the definition information illustrated in FIG. 15, parameters defined for the combination, according to, for example, the syntax illustrated in FIG. 17. Accordingly, codes for such parameters can be omitted for the block.

[Encoding and Decoding Block]

The following describes encoding parameters related to blocks, other than parameters defined by combinations of depth and segment_id. Encoder 100 encodes blocks according to the encoding technology described in Embodiment 1 or typical image compression technology, for example. Here, a detailed description of technologies used for compression is omitted, and encoding parameters is described in detail.

Subsequent to block splitting in the entire picture and encoding segment_ids, encoder 100 encodes information on parameters of blocks obtained by block splitting in the entire picture.

Figure 18:
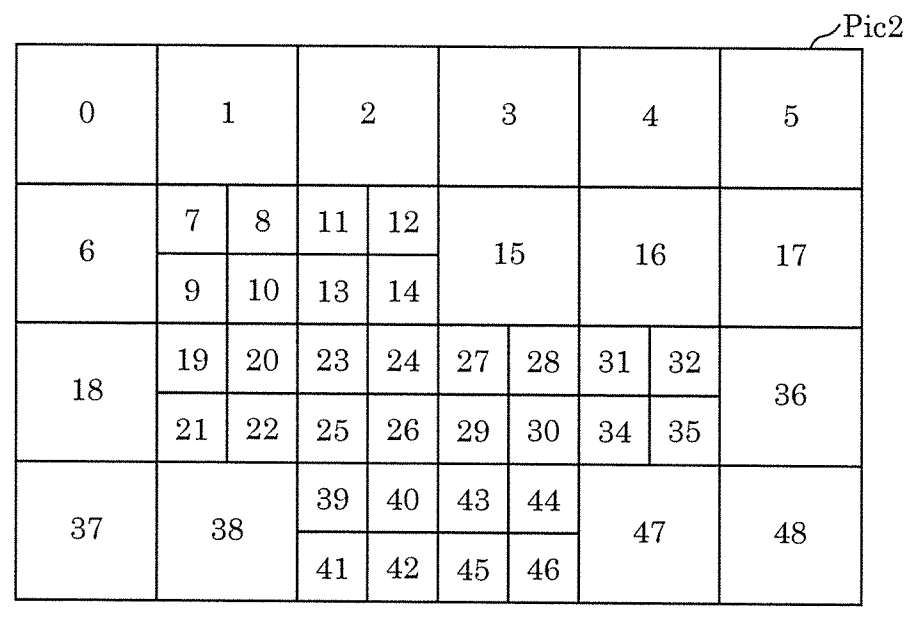

FIG. 18 illustrates an example of the order in which blocks obtained by splitting picture Pic2 are encoded.

Encoder 100 encodes blocks in picture Pic2 in the order from the top leftmost block. If a block is split into four subblocks, encoder 100 scans the four subblocks included in the block in the order of the upper left subblock, the upper right subblock, the lower left subblock, and the lower right subblock. By scanning blocks in such an order, even if a picture includes blocks having different sizes, encoder 100 can sequentially scan and encode the blocks.

Specifically, encoder 100 starts encoding the top leftmost block in picture Pic2, first. Since block_partition for the top leftmost block is "0", encoder 100 does not split the block (that is, a superblock). Thus, the size of the block is a 64×64 pixel size, and a depth for the block is "0". Further, segment_id=0 is assigned to the block. Here, according to the definition information illustrated in FIG. 15, inter_intra=1, seg_QP=13, seg_REFPIC=0, seg_SKIP=0, and seg_context_idx=#0-0 are defined for the combination of depth=0 and segment_id=0. The parameters are associated with the combination of depth=0 and segment_id=0 in the definition information, and thus codes for the parameters can be omitted for a block. As a result, encoder 100 encodes the top leftmost block having a 64×64 pixel size in picture Pic2, by inter prediction using a reference picture identified by reference picture index=No. 0, while maintaining the 64×64 pixel size. At this time, encoder 100 quantizes residual data (namely, a prediction error) in prediction encoding, based on quantization parameter=13, without using a skip mode. Note that quantization parameter=13 may be an absolute value itself, may be indicated by a difference from a given value, or may be indirectly indicated by index information.

Next, entropy encoder 110 performs entropy encoding on, for example, an index number for selecting a motion vector candidate, difference information of a motion vector, and a quantized value of residual data obtained by motion compensation.

As a parameter related to a block, there is an index number for selecting a motion vector candidate. The index number is a number for selecting, from among motion vectors derived from encoded or decoded peripheral blocks spatially or temporally adjacent to a current block, a motion vector candidate to be used for encoding or decoding a motion vector of the current block. When characteristics of a block are known, in the case where a possibility that a motion vector candidate is a zero vector is high, probability indicated by probability information used in CABAC is increased for an encoding pattern for selecting a zero vector. Accordingly, a zero vector can be selected using a small amount of codes. Similarly, if the value indicated by difference information of a motion vector tends to be small, probability information is set to indicate high probability for an encoding pattern with which the amount of codes the difference information is small. Alternatively, if the value indicated by difference information has a tendency to be large, probability information is set to indicate high probability for an encoding pattern with which the amount of codes the difference information is small. Accordingly, the amount of codes can be decreased. Also, it can be expected that the amount of codes can also be decreased for other information by applying suitable probability information. Encoder 100 stores such probability information in a context table, in association with a combination of depth=0 and segment_id=0. Accordingly, it can be expected that encoding efficiency can be improved by selecting probability information based on a depth and segment_id.

Similarly, encoder 100 encodes the second leftmost superblock in the second row from the top in picture Pic2. At this time, encoder 100 scans four subblocks included in the superblock in the order of the upper left subblock, the upper right subblock, the lower left subblock, and the lower right subblock. Encoder 100 encodes the subblocks similarly to encoding the superblocks as described above.

Decoder 200 decodes blocks encoded as mentioned above. Here, decoding an upper left subblock included in the second leftmost superblock in the second row from the top in picture Pic2 is described. The upper left subblock is the seventh block when the block is counted from the top leftmost block (zeroth block) as illustrated in FIG. 18.

Entropy decoder 202 decodes definition information illustrated in FIG. 15, and further decodes block_partition and segment_id of the block. As a result, entropy decoder 202 identifies that the subblock has a 32×32 pixel size (namely, depth=1), and segment_id=0 is assigned to the subblock. Accordingly, entropy decoder 202 decodes the subblock based on such information.

Specifically, entropy decoder 202 applies, to the subblock, the parameters associated with depth=1 and segment_id=0 in the definition information illustrated in FIG. 15. More specifically, inter_intra=1, seg_QP=40, seg_REFPIC=1, seg_SKIP=1, and seg_context_idx=#1-0 are assigned to the combination of depth=1 and segment_id=0, in the definition information illustrated in FIG. 15. Accordingly, entropy decoder 202 derives, for a subblock, parameters for the subblock from definition information of the subblock. As a result, decoder 200 performs inter prediction using a reference picture identified by reference picture index=1, using quantization parameter=40. At this time, decoder 200 does not decode residual data since seg_SKIP=1. Furthermore, decoder 200 decodes the block by decoding remaining parameters related to the block. The remaining parameters include, for instance, an index number for selecting a motion vector candidate and difference information of a motion vector, as mentioned above. Entropy decoder 202 decodes the remaining parameters, using probability information of seg_context_idx associated with the combination of depth=1 and segment_id=0 in the definition information illustrated in FIG. 15. Accordingly, improvement in encoding efficiency can be expected by applying probability information suitable for a block.

[Defining and Updating Probability Information]

It can be expected that encoding efficiency is improved by using probability information suitable for characteristics of each block. The following describes how to define probability information. As a first method, there is a method in which an initial value of predetermined probability information is held. For example, the initial values of I, P, and B pictures are defined in advance in the HEVC standard. As a second method, there is a method of defining a suitable value in a header or a parameter set in a picture or in a higher layer than a picture as in the present embodiment. In this case, suitable probability information can be defined.

In CABAC, each time a parameter is encoded or decoded, probability information is updated. Specifically, entropy encoder 110 and entropy decoder 202 update probability information. For example, when a certain block is encoded by inter prediction, there is a high possibility that a block adjacent to the block is also encoded by inter prediction. Furthermore, when blocks are successively encoded by inter prediction, there is a still higher possibility that a block subsequent to such blocks is encoded by inter prediction. Accordingly, entropy encoder 110 and entropy decoder 202 update probability information of inter_intra which is a flag indicating switching between inter prediction and intra prediction, according to the possibility. Thus, probability information is updated according to the state of encoding or decoding, whereby probability information more suitable for a block is obtained and encoding efficiency is improved.

In view of this, splitter 102 in encoder 100 according to the present embodiment assigns the same segment_id to plural blocks having similar characteristics. Accordingly, entropy encoder 110 and entropy decoder 202 can obtain more suitable probability information each time blocks having the same segment_id are encoded or decoded. For example, entropy encoder 110 and entropy decoder 202 store probability information at the time when encoding or decoding a certain image ends, and use the probability information in encoding or decoding the next image. For example, the certain image and the next image mentioned above are blocks or pictures. In this case, probability information to which a learning effect is applied is applied to the next block or the next picture from the beginning, and thus high encoding efficiency can be expected in CABAC. In this case, probability information is stored for each of plural types of segment_ids, and thus even if one picture includes blocks having different properties, suitable probability information can be applied to each block. Such probability information is identified by seg_context_idx defined for a combination of depth and segment_id, for example. For example, when encoding or decoding a picture starts, the initial value of probability information is identified by seg_context_idx, and updated probability information may be identified by that seg_context_idx, after encoding or decoding the picture has started.

Entropy encoder 110 and entropy decoder 202 may encode and decode, for instance, a flag indicating whether to update probability information, at the end of each block. Accordingly, whether to update probability information can be explicitly determined. For example, encoder 100 encodes and decoder 200 decodes, per block, a picture in which a large subject is captured. At this time, entropy encoder 110 and entropy decoder 202 continue updating probability information when continuously encoding and decoding blocks included in the area of the subject. On the other hand, when entropy encoder 110 encodes and entropy decoder 202 decodes a block included in the area of the subject, and subsequently encodes/decodes a block in which the background outside the area of the subject is captured, properties of images included in the blocks are different. Accordingly, if probability information is updated in such encoding and decoding, the actual image and probability showing the properties of the images are different. Thus, in such a case, entropy encoder 110 and entropy decoder 202 maintain the probability information obtained when encoding and decoding a previous block, without updating the probability information, so that entropy encoder 110 and entropy decoder 202 can encode and decode the next block, using suitable probability information.

[Overall Processing Operation]

Figure 19:
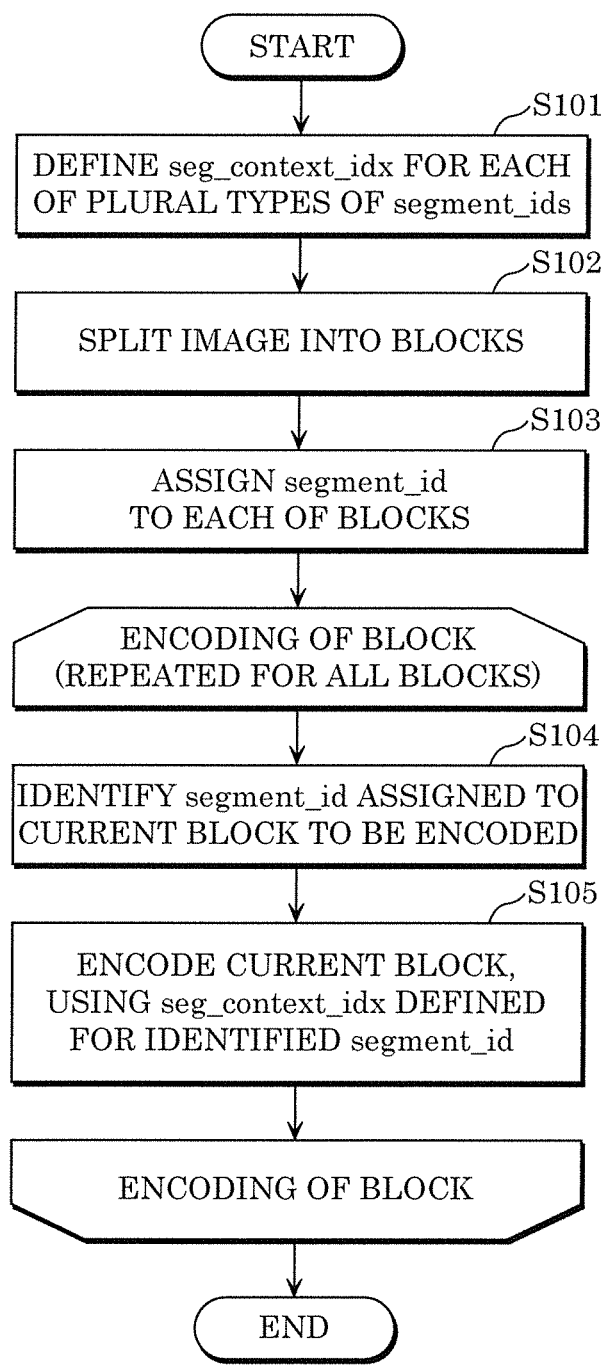
FIG. 19 is a flowchart illustrating overall processing operation of an encoder in Embodiment 2.

FIG. 19 is a flowchart illustrating the overall processing operation of encoder 100 in the present embodiment.

Encoder 100 defines at least one parameter for each of plural types of segment_ids for identifying block types (step S101). The at least one parameter includes seg_context_idx which is a parameter for identifying probability information associated with context used in CABAC.

Next, encoder 100 splits an image into plural blocks (step S102), and assigns, to each of the blocks, segment_id according to the type of the block among the plural types of segment_ids (step S103).

Next, encoder 100 sequentially encodes the blocks. At this time, encoder 100 identifies segment_id assigned to a current block to be encoded among the blocks (step S104). Encoder 100 encodes the current block, using at least one parameter which is defined for identified segment_id and includes seg_context_idx (step S105).

Figure 20:
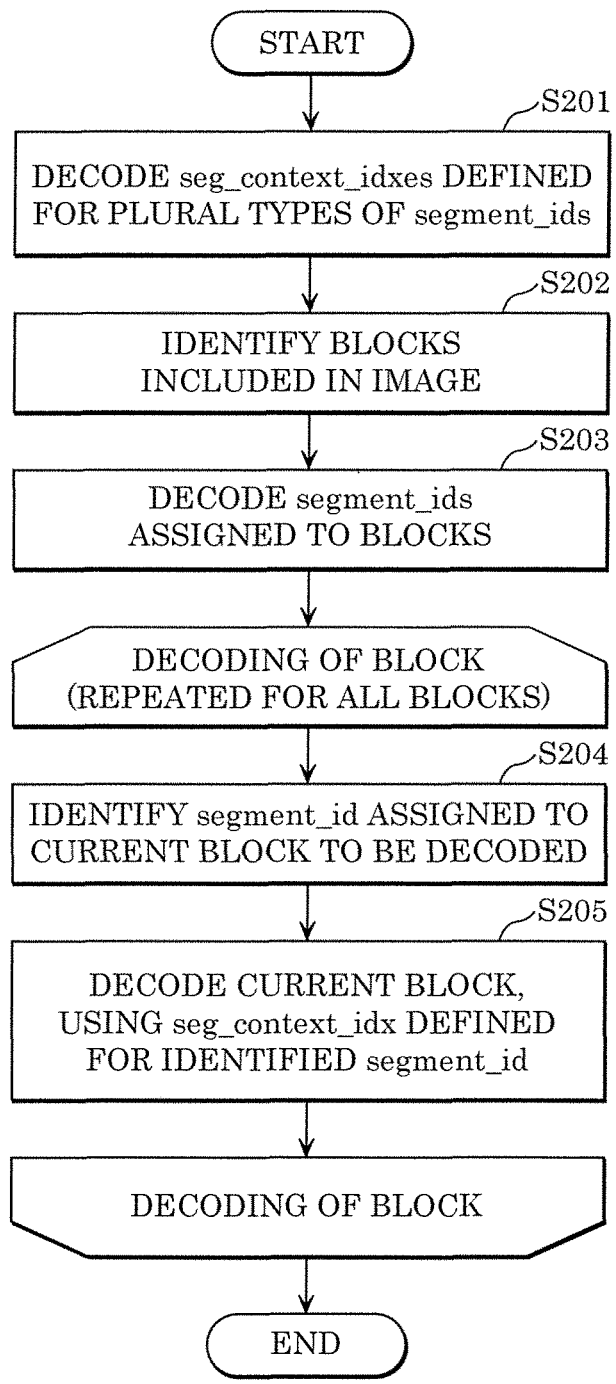
FIG. 20 is a flowchart illustrating overall processing operation of a decoder in Embodiment 2.

FIG. 20 is a flowchart illustrating the overall processing operation of decoder 200 in the present embodiment.

Decoder 200 decodes at least one parameter defined for each of plural types of segment_ids for identifying block types (step S201). The at least one parameter includes seg_context_idx which is a parameter for identifying probability information associated with context used in CABAC.

Next, decoder 200 identifies plural blocks included in an image (step S202), and decodes segment_ids assigned to the blocks (step S203).

Next, decoder 200 sequentially decodes the blocks. At this time, decoder 200 identifies segment_id assigned to a current block to be decoded among the blocks (step S204). Decoder 200 decodes the current block, using at least one parameter which is defined for identified segment_id and includes seg_context_idx (step S205).

An encoder according to an aspect of the present disclosure includes: processing circuitry; and a memory coupled to the processing circuitry, wherein using the memory, the processing circuitry defines at least one parameter for each of plural types of segment identification information for identifying block types, splits an image into blocks, assigns, to each of the blocks, segment identification information according to a type of the block, among the plural types of segment identification information, and encodes each of the blocks, and in encoding each of the blocks, the processing circuitry identifies, among the plural types of segment identification information, segment identification information assigned to a current block to be encoded among the blocks, and encodes the current block using the at least one parameter defined for the segment identification information identified, and the at least one parameter includes a parameter for identifying probability information associated with context used in context-based adaptive binary arithmetic coding (CABAC). The segment identification information is, for example, segment_id described above, and the parameter for identifying probability information is, for example, seg_context_idx described above.

Accordingly, parameters including seg_context_idx are defined for each of plural types of segment_ids. Furthermore, to each of blocks, segment_id according to the type (namely, characteristics) of the block is assigned. Accordingly, it is not necessary to encode, for each of the blocks, seg_context_idx for identifying probability information suitable for the block, and thus encoding efficiency can be improved. Specifically, an image is split into blocks, and segment_ids are given to the blocks, whereby an amount of codes to be used when encoding blocks can be decreased. In addition, probability information used in context adaptive binary arithmetic coding (CABAC) is switched using segment_id, and thus improvement in encoding efficiency for a parameter for probability information can be expected, and thus further improvement in encoding efficiency can be expected.

For example, the processing circuitry may further encode block split information indicating a split pattern of the image.

Accordingly, the pattern of split performed by the encoder can be suitably notified to the decoder.

The processing circuitry may further include, in a picture parameter set, the at least one parameter defined for each of the plural types of segment identification information, and the image split by the processing circuitry may be a picture.

Accordingly, on a per-picture basis, each of pictures can be encoded using parameters suitable for blocks included in the picture.

In defining the at least one parameter, the processing circuitry may define the at least one parameter for a combination of one of the plural types of segment identification information and one of plural types of size identification information for identifying block sizes, and in encoding the current block, the processing circuitry may encode the current block using the at least one parameter defined for a combination of the segment identification information identified and size identification information according to a size of the current block among the plural types of size identification information.

Accordingly, a suitable parameter according to the size and the type of a block can be used for encoding the block, and thus encoding efficiency can be improved.

A decoder according to an aspect of the present disclosure includes: processing circuitry; and a memory coupled to the processing circuitry, wherein using the memory, the processing circuitry decodes at least one parameter defined for each of plural types of segment identification information for identifying block types, identifies blocks included in an image, decodes segment identification information assigned to each of the blocks, and decodes each of the blocks, and in decoding each of the blocks, the processing circuitry identifies, among the plural types of segment identification information, segment identification information assigned to a current block to be decoded among the blocks, and decodes the current block using the at least one parameter defined for the segment identification information identified, and the at least one parameter includes a parameter for identifying probability information associated with context used in context-based adaptive binary arithmetic coding (CABAC).

Accordingly, information obtained by encoding by the above encoder can be decoded appropriately. Specifically, improvement in encoding efficiency can be achieved.

For example, in identifying the blocks, the processing circuitry may decode block split information indicating a split pattern of the image, and identify blocks included in the image, based on the block split information.

Accordingly, blocks included in an image can be appropriately identified, according to a pattern of split performed by the encoder.

In decoding the at least one parameter, the processing circuitry may extract from a picture parameter set and decode the at least one parameter defined for each of the plural types of segment identification information, and the image which includes the blocks identified by the processing circuitry may be a picture.

Accordingly, on a per-picture basis, each of pictures can be decoded using parameters suitable for blocks included in the picture.

In decoding the at least one parameter, the processing circuitry may identify the at least one parameter defined for a combination of one of the plural types of segment identification information and one of plural types of size identification information for identifying block sizes, and in decoding the current block, the processing circuitry may decode the current block using the at least one parameter defined for a combination of the segment identification information identified and size identification information according to a size of the current block among the plural types of size identification information.

Accordingly, a suitable parameter according to the size and the type of a block can be used for decoding the block, and thus encoding efficiency can be improved.

OTHER EMBODIMENTS

As described in each of the above embodiments, each functional block can typically be realized as an MPU and memory, for example. Moreover, processes performed by each of the functional blocks are typically realized by a program execution unit, such as a processor, reading and executing software (a program) recorded on a recording medium such as ROM. The software may be distributed via, for example, downloading, and may be recorded on a recording medium such as semiconductor memory and distributed. Note that each functional block can, of course, also be realized as hardware (dedicated circuit).

Moreover, the processing described in each of the embodiments may be realized via integrated processing using a single apparatus (system), and, alternatively, may be realized via decentralized processing using a plurality of apparatuses. Moreover, the processor that executes the above-described program may be a single processor or a plurality of processors. In other words, integrated processing may be performed, and, alternatively, decentralized processing may be performed.

Embodiments of the present disclosure are not limited to the above exemplary embodiments; various modifications may be made to the exemplary embodiments, the results of which are also included within the scope of the embodiments of the present disclosure.

Next, application examples of the moving picture encoding method (image encoding method) and the moving picture decoding method (image decoding method) described in each of the above embodiments and a system that employs the same will be described. The system is characterized as including an image encoder that employs the image encoding method, an image decoder that employs the image decoding method, and an image encoder/decoder that includes both the image encoder and the image decoder. Other configurations included in the system may be modified on a case-by-case basis.

Usage Examples

Figure 21:
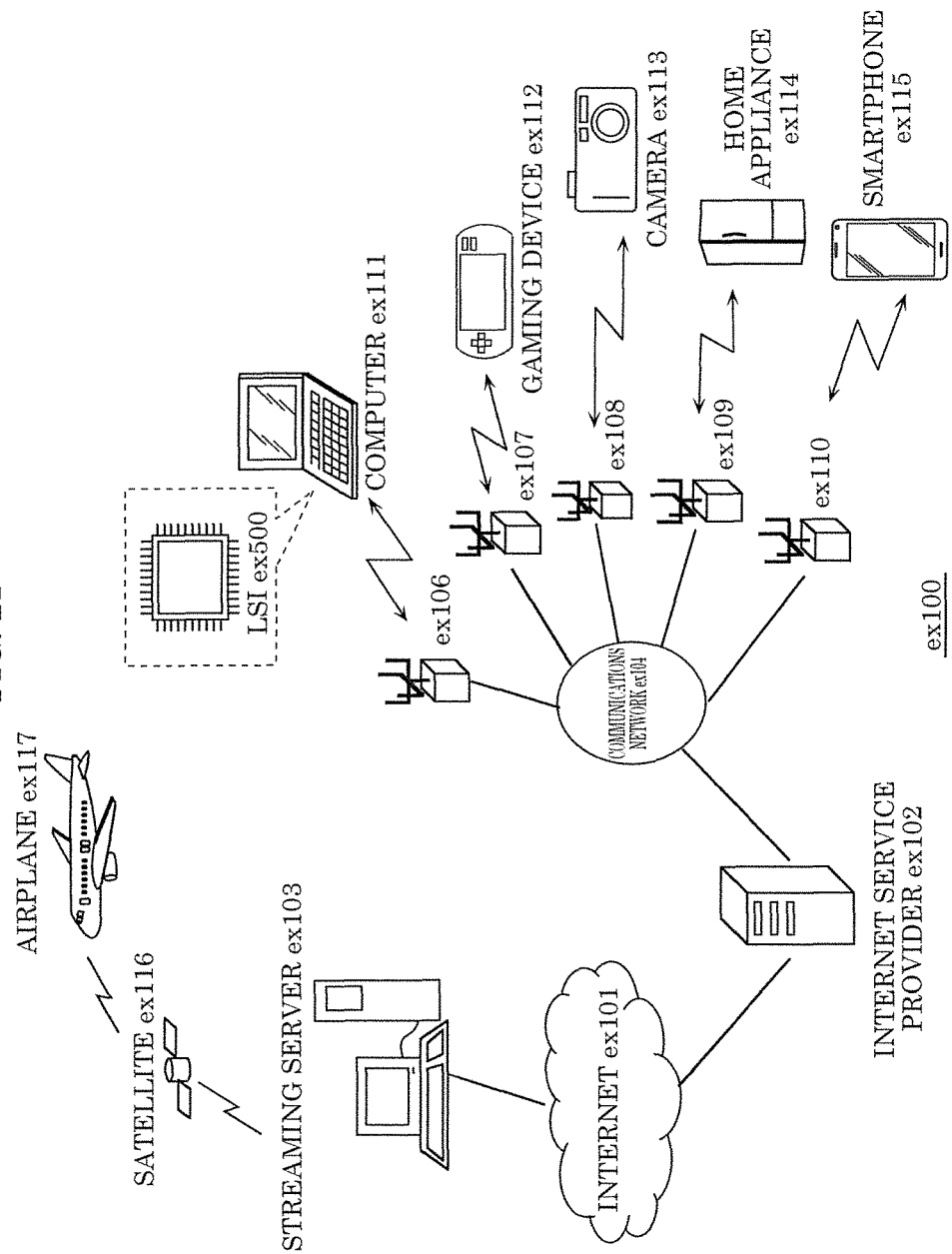
FIG. 21 illustrates an overall configuration of a content providing system for implementing a content distribution service.

FIG. 21 illustrates an overall configuration of content providing system ex100 for implementing a content distribution service. The area in which the communication service is provided is divided into cells of desired sizes, and base stations ex106, ex107, ex108, ex109, and ex110, which are fixed wireless stations, are located in respective cells.

In content providing system ex100, devices including computer ex111, gaming device ex112, camera ex113, home appliance ex114, and smartphone ex115 are connected to internet ex101 via internet service provider ex102 or communications network ex104 and base stations ex106 through ex110. Content providing system ex100 may combine and connect any combination of the above elements. The devices may be directly or indirectly connected together via a telephone network or near field communication rather than via base stations ex106 through ex110, which are fixed wireless stations. Moreover, streaming server ex103 is connected to devices including computer ex111, gaming device ex112, camera ex113, home appliance ex114, and smartphone ex115 via, for example, internet ex101. Streaming server ex103 is also connected to, for example, a terminal in a hotspot in airplane ex117 via satellite ex116.

Note that instead of base stations ex106 through ex110, wireless access points or hotspots may be used. Streaming server ex103 may be connected to communications network ex104 directly instead of via internet ex101 or internet service provider ex102, and may be connected to airplane ex117 directly instead of via satellite ex116.

Camera ex113 is a device capable of capturing still images and video, such as a digital camera. Smartphone ex115 is a smartphone device, cellular phone, or personal handyphone system (PHS) phone that can operate under the mobile communications system standards of the typical 2G, 3G, 3.9G, and 4G systems, as well as the next-generation 5G system.

Home appliance ex118 is, for example, a refrigerator or a device included in a home fuel cell cogeneration system.

In content providing system ex100, a terminal including an image and/or video capturing function is capable of, for example, live streaming by connecting to streaming server ex103 via, for example, base station ex106. When live streaming, a terminal (e.g., computer ex111, gaming device ex112, camera ex113, home appliance ex114, smartphone ex115, or airplane ex117) performs the encoding processing described in the above embodiments on still-image or video content captured by a user via the terminal, multiplexes video data obtained via the encoding and audio data obtained by encoding audio corresponding to the video, and transmits the obtained data to streaming server ex103. In other words, the terminal functions as the image encoder according to one aspect of the present disclosure.

Streaming server ex103 streams transmitted content data to clients that request the stream. Client examples include computer ex111, gaming device ex112, camera ex113, home appliance ex114, smartphone ex115, and terminals inside airplane ex117, which are capable of decoding the above-described encoded data. Devices that receive the streamed data decode and reproduce the received data. In other words, the devices each function as the image decoder according to one aspect of the present disclosure.

(Decentralized Processing)

Streaming server ex103 may be realized as a plurality of servers or computers between which tasks such as the processing, recording, and streaming of data are divided. For example, streaming server ex103 may be realized as a content delivery network (CDN) that streams content via a network connecting multiple edge servers located throughout the world. In a CDN, an edge server physically near the client is dynamically assigned to the client. Content is cached and streamed to the edge server to reduce load times. In the event of, for example, some kind of an error or a change in connectivity due to, for example, a spike in traffic, it is possible to stream data stably at high speeds since it is possible to avoid affected parts of the network by, for example, dividing the processing between a plurality of edge servers or switching the streaming duties to a different edge server, and continuing streaming.

Decentralization is not limited to just the division of processing for streaming; the encoding of the captured data may be divided between and performed by the terminals, on the server side, or both. In one example, in typical encoding, the processing is performed in two loops. The first loop is for detecting how complicated the image is on a frame-by-frame or scene-by-scene basis, or detecting the encoding load. The second loop is for processing that maintains image quality and improves encoding efficiency. For example, it is possible to reduce the processing load of the terminals and improve the quality and encoding efficiency of the content by having the terminals perform the first loop of the encoding and having the server side that received the content perform the second loop of the encoding. In such a case, upon receipt of a decoding request, it is possible for the encoded data resulting from the first loop performed by one terminal to be received and reproduced on another terminal in approximately real time. This makes it possible to realize smooth, real-time streaming.

In another example, camera ex113 or the like extracts a feature amount from an image, compresses data related to the feature amount as metadata, and transmits the compressed metadata to a server. For example, the server determines the significance of an object based on the feature amount and changes the quantization accuracy accordingly to perform compression suitable for the meaning of the image. Feature amount data is particularly effective in improving the precision and efficiency of motion vector prediction during the second compression pass performed by the server. Moreover, encoding that has a relatively low processing load, such as variable length coding (VLC), may be handled by the terminal, and encoding that has a relatively high processing load, such as context-adaptive binary arithmetic coding (CABAC), may be handled by the server.

In yet another example, there are instances in which a plurality of videos of approximately the same scene are captured by a plurality of terminals in, for example, a stadium, shopping mall, or factory. In such a case, for example, the encoding may be decentralized by dividing processing tasks between the plurality of terminals that captured the videos and, if necessary, other terminals that did not capture the videos and the server, on a per-unit basis. The units may be, for example, groups of pictures (GOP), pictures, or tiles resulting from dividing a picture. This makes it possible to reduce load times and achieve streaming that is closer to real-time.

Moreover, since the videos are of approximately the same scene, management and/or instruction may be carried out by the server so that the videos captured by the terminals can be cross-referenced. Moreover, the server may receive encoded data from the terminals, change reference relationship between items of data or correct or replace pictures themselves, and then perform the encoding. This makes it possible to generate a stream with increased quality and efficiency for the individual items of data.

Moreover, the server may stream video data after performing transcoding to convert the encoding format of the video data. For example, the server may convert the encoding format from MPEG to VP, and may convert H.264 to H.265.

In this way, encoding can be performed by a terminal or one or more servers. Accordingly, although the device that performs the encoding is referred to as a "server" or "terminal" in the following description, some or all of the processes performed by the server may be performed by the terminal, and likewise some or all of the processes performed by the terminal may be performed by the server. This also applies to decoding processes.

(3D, Multi-Angle)

In recent years, usage of images or videos combined from images or videos of different scenes concurrently captured or the same scene captured from different angles by a plurality of terminals such as camera ex113 and/or smartphone ex115 has increased. Videos captured by the terminals are combined based on, for example, the separately-obtained relative positional relationship between the terminals, or regions in a video having matching feature points.

In addition to the encoding of two-dimensional moving pictures, the server may encode a still image based on scene analysis of a moving picture either automatically or at a point in time specified by the user, and transmit the encoded still image to a reception terminal. Furthermore, when the server can obtain the relative positional relationship between the video capturing terminals, in addition to two-dimensional moving pictures, the server can generate three-dimensional geometry of a scene based on video of the same scene captured from different angles. Note that the server may separately encode three-dimensional data generated from, for example, a point cloud, and may, based on a result of recognizing or tracking a person or object using three-dimensional data, select or reconstruct and generate a video to be transmitted to a reception terminal from videos captured by a plurality of terminals.

This allows the user to enjoy a scene by freely selecting videos corresponding to the video capturing terminals, and allows the user to enjoy the content obtained by extracting, from three-dimensional data reconstructed from a plurality of images or videos, a video from a selected viewpoint. Furthermore, similar to with video, sound may be recorded from relatively different angles, and the server may multiplex, with the video, audio from a specific angle or space in accordance with the video, and transmit the result.

In recent years, content that is a composite of the real world and a virtual world, such as virtual reality (VR) and augmented reality (AR) content, has also become popular. In the case of VR images, the server may create images from the viewpoints of both the left and right eyes and perform encoding that tolerates reference between the two viewpoint images, such as multi-view coding (MVC), and, alternatively, may encode the images as separate streams without referencing. When the images are decoded as separate streams, the streams may be synchronized when reproduced so as to recreate a virtual three-dimensional space in accordance with the viewpoint of the user.

In the case of AR images, the server superimposes virtual object information existing in a virtual space onto camera information representing a real-world space, based on a three-dimensional position or movement from the perspective of the user. The decoder may obtain or store virtual object information and three-dimensional data, generate two-dimensional images based on movement from the perspective of the user, and then generate superimposed data by seamlessly connecting the images. Alternatively, the decoder may transmit, to the server, motion from the perspective of the user in addition to a request for virtual object information, and the server may generate superimposed data based on three-dimensional data stored in the server in accordance with the received motion, and encode and stream the generated superimposed data to the decoder. Note that superimposed data includes, in addition to RGB values, an a value indicating transparency, and the server sets the a value for sections other than the object generated from three-dimensional data to, for example, 0, and may perform the encoding while those sections are transparent. Alternatively, the server may set the background to a predetermined RGB value, such as a chroma key, and generate data in which areas other than the object are set as the background.

Decoding of similarly streamed data may be performed by the client (i.e., the terminals), on the server side, or divided therebetween. In one example, one terminal may transmit a reception request to a server, the requested content may be received and decoded by another terminal, and a decoded signal may be transmitted to a device having a display. It is possible to reproduce high image quality data by decentralizing processing and appropriately selecting content regardless of the processing ability of the communications terminal itself. In yet another example, while a TV, for example, is receiving image data that is large in size, a region of a picture, such as a tile obtained by dividing the picture, may be decoded and displayed on a personal terminal or terminals of a viewer or viewers of the TV. This makes it possible for the viewers to share a big-picture view as well as for each viewer to check his or her assigned area or inspect a region in further detail up close.

In the future, both indoors and outdoors, in situations in which a plurality of wireless connections are possible over near, mid, and far distances, it is expected to be able to seamlessly receive content even when switching to data appropriate for the current connection, using a streaming system standard such as MPEG-DASH. With this, the user can switch between data in real time while freely selecting a decoder or display apparatus including not only his or her own terminal, but also, for example, displays disposed indoors or outdoors. Moreover, based on, for example, information on the position of the user, decoding can be performed while switching which terminal handles decoding and which terminal handles the displaying of content. This makes it possible to, while in route to a destination, display, on the wall of a nearby building in which a device capable of displaying content is embedded or on part of the ground, map information while on the move. Moreover, it is also possible to switch the bit rate of the received data based on the accessibility to the encoded data on a network, such as when encoded data is cached on a server quickly accessible from the reception terminal or when encoded data is copied to an edge server in a content delivery service.

(Scalable Encoding)

Figure 22:
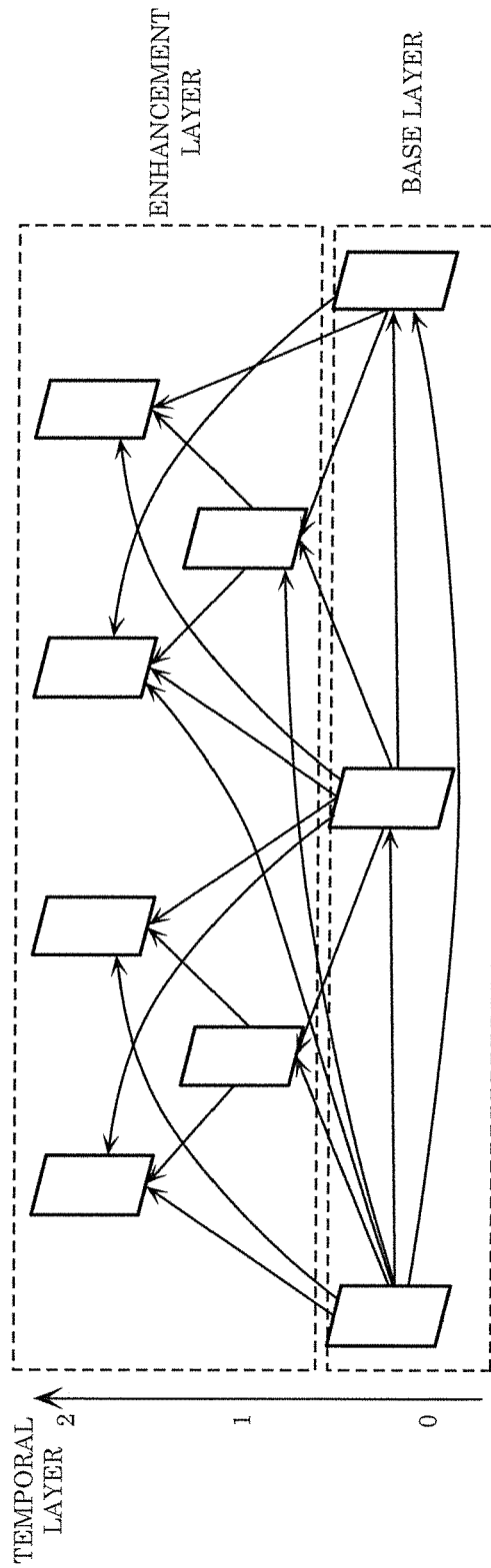
FIG. 22 illustrates one example of encoding structure in scalable encoding.

The switching of content will be described with reference to a scalable stream, illustrated in FIG. 22, that is compression coded via implementation of the moving picture encoding method described in the above embodiments. The server may have a configuration in which content is switched while making use of the temporal and/or spatial scalability of a stream, which is achieved by division into and encoding of layers, as illustrated in FIG. 22. Note that there may be a plurality of individual streams that are of the same content but different quality. In other words, by determining which layer to decode up to based on internal factors, such as the processing ability on the decoder side, and external factors, such as communication bandwidth, the decoder side can freely switch between low resolution content and high resolution content while decoding. For example, in a case in which the user wants to continue watching, at home on a device such as a TV connected to the internet, a video that he or she had been previously watching on smartphone ex115 while on the move, the device can simply decode the same stream up to a different layer, which reduces server side load.

Furthermore, in addition to the configuration described above in which scalability is achieved as a result of the pictures being encoded per layer and the enhancement layer is above the base layer, the enhancement layer may include metadata based on, for example, statistical information on the image, and the decoder side may generate high image quality content by performing super-resolution imaging on a picture in the base layer based on the metadata. Super-resolution imaging may be improving the SN ratio while maintaining resolution and/or increasing resolution. Metadata includes information for identifying a linear or a non-linear filter coefficient used in super-resolution processing, or information identifying a parameter value in filter processing, machine learning, or least squares method used in super-resolution processing.

Figure 23:
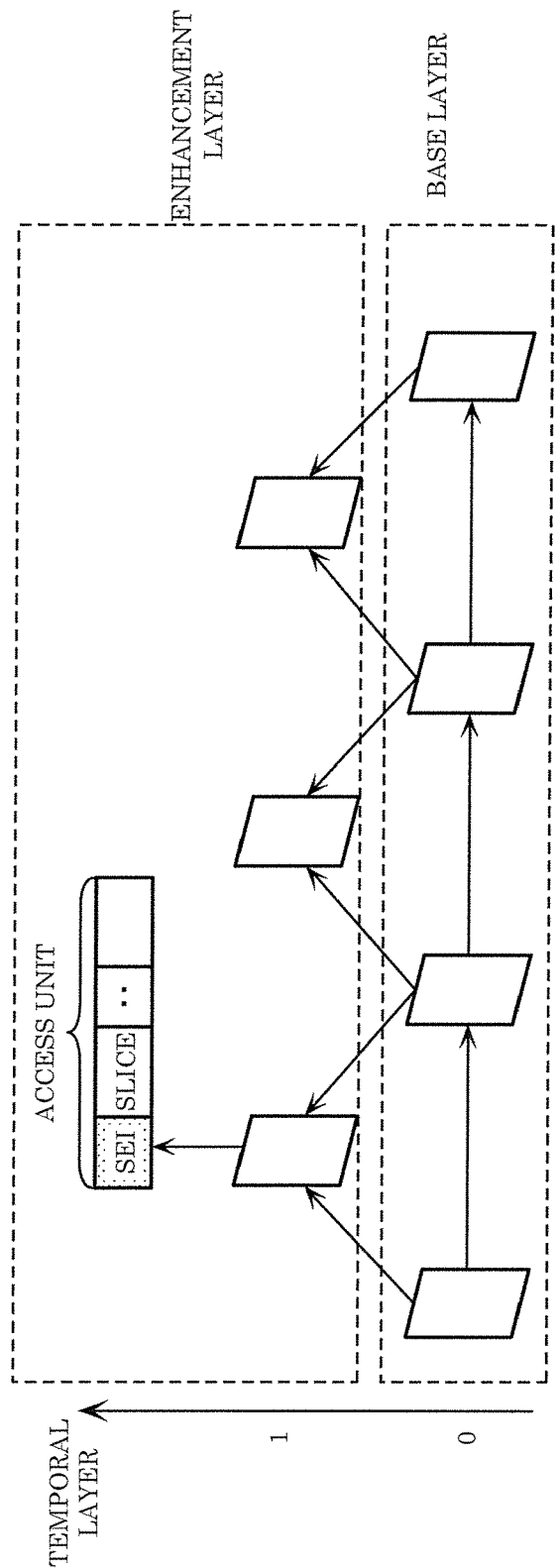
FIG. 23 illustrates one example of encoding structure in scalable encoding.

Alternatively, a configuration in which a picture is divided into, for example, tiles in accordance with the meaning of, for example, an object in the image, and on the decoder side, only a partial region is decoded by selecting a tile to decode, is also acceptable. Moreover, by storing an attribute about the object (person, car, ball, etc.) and a position of the object in the video (coordinates in identical images) as metadata, the decoder side can identify the position of a desired object based on the metadata and determine which tile or tiles include that object. For example, as illustrated in FIG. 23, metadata is stored using a data storage structure different from pixel data such as an SEI message in HEVC. This metadata indicates, for example, the position, size, or color of the main object.

Moreover, metadata may be stored in units of a plurality of pictures, such as stream, sequence, or random access units. With this, the decoder side can obtain, for example, the time at which a specific person appears in the video, and by fitting that with picture unit information, can identify a picture in which the object is present and the position of the object in the picture.

(Web Page Optimization)

Figure 24:
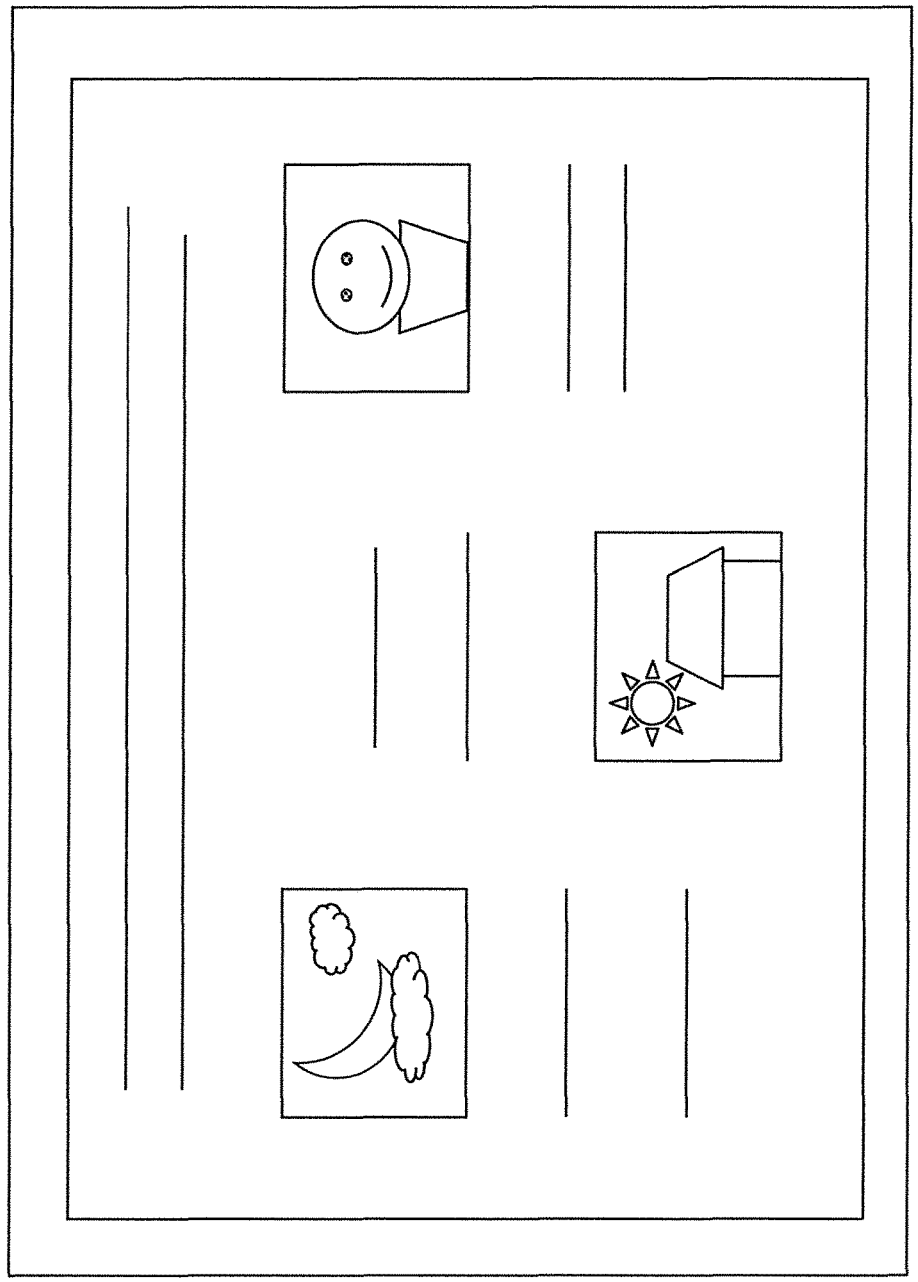
FIG. 24 illustrates an example of a display screen of a web page.
Figure 25:
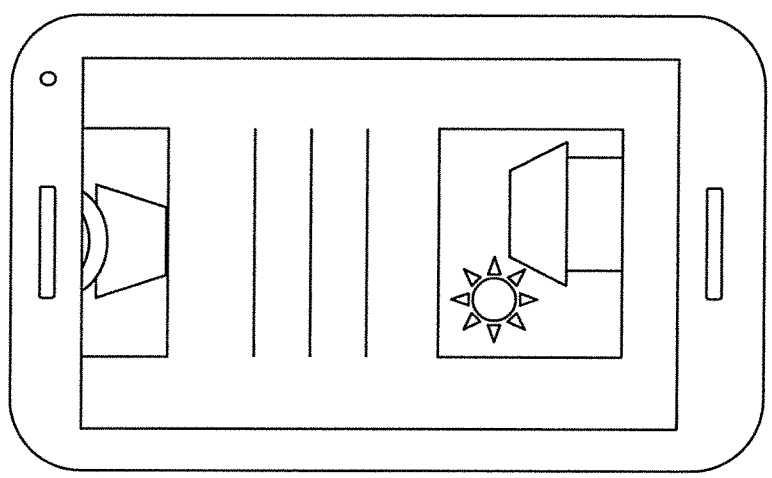
FIG. 25 illustrates an example of a display screen of a web page.

FIG. 24 illustrates an example of a display screen of a web page on, for example, computer ex111. FIG. 25 illustrates an example of a display screen of a web page on, for example, smartphone ex115. As illustrated in FIG. 24 and FIG. 25, a web page may include a plurality of image links which are links to image content, and the appearance of the web page differs depending on the device used to view the web page. When a plurality of image links are viewable on the screen, until the user explicitly selects an image link, or until the image link is in the approximate center of the screen or the entire image link fits in the screen, the display apparatus (decoder) displays, as the image links, still images included in the content or I pictures, displays video such as an animated gif using a plurality of still images or I pictures, for example, or receives only the base layer and decodes and displays the video.

When an image link is selected by the user, the display apparatus decodes giving the highest priority to the base layer. Note that if there is information in the HTML code of the web page indicating that the content is scalable, the display apparatus may decode up to the enhancement layer. Moreover, in order to guarantee real time reproduction, before a selection is made or when the bandwidth is severely limited, the display apparatus can reduce delay between the point in time at which the leading picture is decoded and the point in time at which the decoded picture is displayed (that is, the delay between the start of the decoding of the content to the displaying of the content) by decoding and displaying only forward reference pictures (I picture, P picture, forward reference B picture). Moreover, the display apparatus may purposely ignore the reference relationship between pictures and coarsely decode all B and P pictures as forward reference pictures, and then perform normal decoding as the number of pictures received over time increases.

(Autonomous Driving)

When transmitting and receiving still image or video data such two- or three-dimensional map information for autonomous driving or assisted driving of an automobile, the reception terminal may receive, in addition to image data belonging to one or more layers, information on, for example, the weather or road construction as metadata, and associate the metadata with the image data upon decoding. Note that metadata may be assigned per layer and, alternatively, may simply be multiplexed with the image data.

In such a case, since the automobile, drone, airplane, etc., including the reception terminal is mobile, the reception terminal can seamlessly receive and decode while switching between base stations among base stations ex106 through ex110 by transmitting information indicating the position of the reception terminal upon reception request. Moreover, in accordance with the selection made by the user, the situation of the user, or the bandwidth of the connection, the reception terminal can dynamically select to what extent the metadata is received or to what extent the map information, for example, is updated.

With this, in content providing system ex100, the client can receive, decode, and reproduce, in real time, encoded information transmitted by the user.

(Streaming of Individual Content)

In content providing system ex100, in addition to high image quality, long content distributed by a video distribution entity, unicast or multicast streaming of low image quality, short content from an individual is also possible. Moreover, such content from individuals is likely to further increase in popularity. The server may first perform editing processing on the content before the encoding processing in order to refine the individual content. This may be achieved with, for example, the following configuration.

In real-time while capturing video or image content or after the content has been captured and accumulated, the server performs recognition processing based on the raw or encoded data, such as capture error processing, scene search processing, meaning analysis, and/or object detection processing. Then, based on the result of the recognition processing, the server—either when prompted or automatically—edits the content, examples of which include: correction such as focus and/or motion blur correction; removing low-priority scenes such as scenes that are low in brightness compared to other pictures or out of focus; object edge adjustment; and color tone adjustment. The server encodes the edited data based on the result of the editing. It is known that excessively long videos tend to receive fewer views. Accordingly, in order to keep the content within a specific length that scales with the length of the original video, the server may, in addition to the low-priority scenes described above, automatically clip out scenes with low movement based on an image processing result. Alternatively, the server may generate and encode a video digest based on a result of an analysis of the meaning of a scene.

Note that there are instances in which individual content may include content that infringes a copyright, moral right, portrait rights, etc. Such an instance may lead to an unfavorable situation for the creator, such as when content is shared beyond the scope intended by the creator. Accordingly, before encoding, the server may, for example, edit images so as to blur faces of people in the periphery of the screen or blur the inside of a house, for example. Moreover, the server may be configured to recognize the faces of people other than a registered person in images to be encoded, and when such faces appear in an image, for example, apply a mosaic filter to the face of the person. Alternatively, as pre- or post-processing for encoding, the user may specify, for copyright reasons, a region of an image including a person or a region of the background be processed, and the server may process the specified region by, for example, replacing the region with a different image or blurring the region. If the region includes a person, the person may be tracked in the moving picture the head region may be replaced with another image as the person moves.

Moreover, since there is a demand for real-time viewing of content produced by individuals, which tends to be small in data size, the decoder first receives the base layer as the highest priority and performs decoding and reproduction, although this may differ depending on bandwidth. When the content is reproduced two or more times, such as when the decoder receives the enhancement layer during decoding and reproduction of the base layer and loops the reproduction, the decoder may reproduce a high image quality video including the enhancement layer. If the stream is encoded using such scalable encoding, the video may be low quality when in an unselected state or at the start of the video, but it can offer an experience in which the image quality of the stream progressively increases in an intelligent manner. This is not limited to just scalable encoding; the same experience can be offered by configuring a single stream from a low quality stream reproduced for the first time and a second stream encoded using the first stream as a reference.

Other Usage Examples

The encoding and decoding may be performed by LSI ex500, which is typically included in each terminal. LSI ex500 may be configured of a single chip or a plurality of chips. Software for encoding and decoding moving pictures may be integrated into some type of a recording medium (such as a CD-ROM, a flexible disk, or a hard disk) that is readable by, for example, computer ex111, and the encoding and decoding may be performed using the software. Furthermore, when smartphone ex115 is equipped with a camera, the video data obtained by the camera may be transmitted. In this case, the video data is coded by LSI ex500 included in smartphone ex115.

Note that LSI ex500 may be configured to download and activate an application. In such a case, the terminal first determines whether it is compatible with the scheme used to encode the content or whether it is capable of executing a specific service. When the terminal is not compatible with the encoding scheme of the content or when the terminal is not capable of executing a specific service, the terminal first downloads a codec or application software then obtains and reproduces the content.

Aside from the example of content providing system ex100 that uses internet ex101, at least the moving picture encoder (image encoder) or the moving picture decoder (image decoder) described in the above embodiments may be implemented in a digital broadcasting system. The same encoding processing and decoding processing may be applied to transmit and receive broadcast radio waves superimposed with multiplexed audio and video data using, for example, a satellite, even though this is geared toward multicast whereas unicast is easier with content providing system ex100.

(Hardware Configuration)

Figure 26:
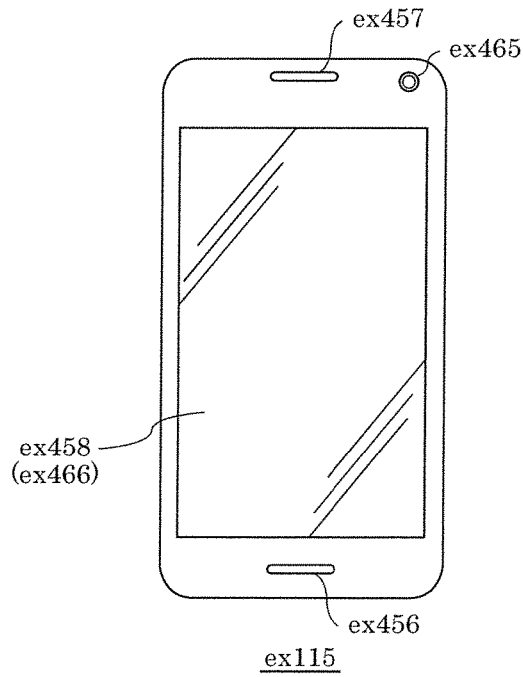
FIG. 26 illustrates one example of a smartphone.
Figure 27:
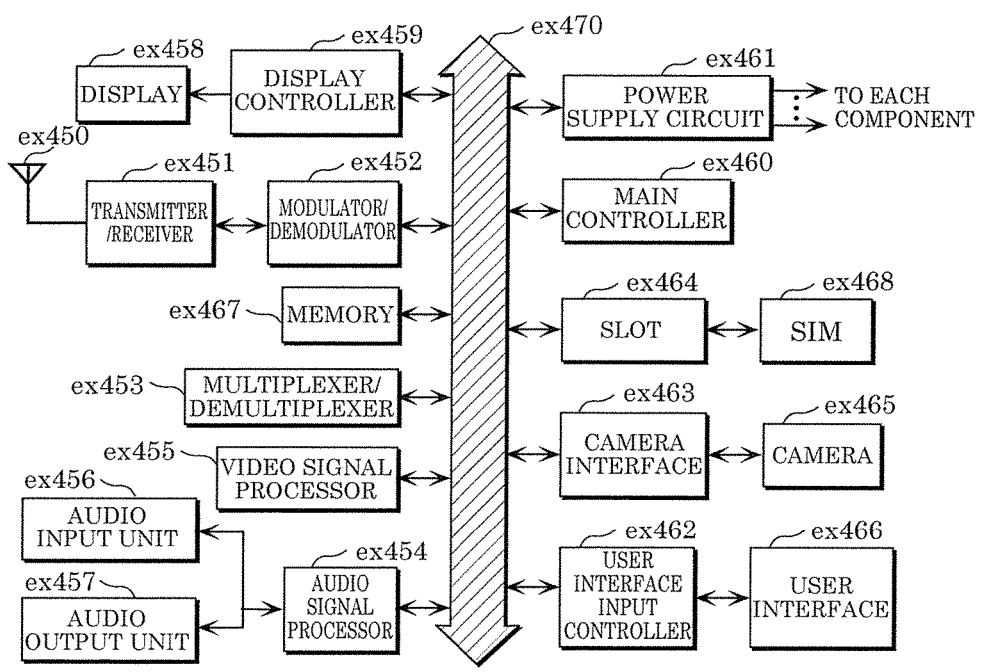
FIG. 27 is a block diagram illustrating a configuration example of a smartphone.

FIG. 26 illustrates smartphone ex115. FIG. 27 illustrates a configuration example of smartphone ex115. Smartphone ex115 includes antenna ex450 for transmitting and receiving radio waves to and from base station ex110, camera ex465 capable of capturing video and still images, and display ex458 that displays decoded data, such as video captured by camera ex465 and video received by antenna ex450. Smartphone ex115 further includes user interface ex466 such as a touch panel, audio output unit ex457 such as a speaker for outputting speech or other audio, audio input unit ex456 such as a microphone for audio input, memory ex467 capable of storing decoded data such as captured video or still images, recorded audio, received video or still images, and mail, as well as decoded data, and slot ex464 which is an interface for SIM ex468 for authorizing access to a network and various data. Note that external memory may be used instead of memory ex467.

Moreover, main controller ex460 which comprehensively controls display ex458 and user interface ex466, power supply circuit ex461, user interface input controller ex462, video signal processor ex455, camera interface ex463, display controller ex459, modulator/demodulator ex452, multiplexer/demultiplexer ex453, audio signal processor ex454, slot ex464, and memory ex467 are connected via bus ex470.

When the user turns the power button of power supply circuit ex461 on, smartphone ex115 is powered on into an operable state by each component being supplied with power from a battery pack.

Smartphone ex115 performs processing for, for example, calling and data transmission, based on control performed by main controller ex460, which includes a CPU, ROM, and RAM. When making calls, an audio signal recorded by audio input unit ex456 is converted into a digital audio signal by audio signal processor ex454, and this is applied with spread spectrum processing by modulator/demodulator ex452 and digital-analog conversion and frequency conversion processing by transmitter/receiver ex451, and then transmitted via antenna ex450. The received data is amplified, frequency converted, and analog-digital converted, inverse spread spectrum processed by modulator/demodulator ex452, converted into an analog audio signal by audio signal processor ex454, and then output from audio output unit ex457. In data transmission mode, text, still-image, or video data is transmitted by main controller ex460 via user interface input controller ex462 as a result of operation of, for example, user interface ex466 of the main body, and similar transmission and reception processing is performed. In data transmission mode, when sending a video, still image, or video and audio, video signal processor ex455 compression encodes, via the moving picture encoding method described in the above embodiments, a video signal stored in memory ex467 or a video signal input from camera ex465, and transmits the encoded video data to multiplexer/demultiplexer ex453. Moreover, audio signal processor ex454 encodes an audio signal recorded by audio input unit ex456 while camera ex465 is capturing, for example, a video or still image, and transmits the encoded audio data to multiplexer/demultiplexer ex453. Multiplexer/demultiplexer ex453 multiplexes the encoded video data and encoded audio data using a predetermined scheme, modulates and converts the data using modulator/demodulator (modulator/demodulator circuit) ex452 and transmitter/receiver ex451, and transmits the result via antenna ex450.

When video appended in an email or a chat, or a video linked from a web page, for example, is received, in order to decode the multiplexed data received via antenna ex450, multiplexer/demultiplexer ex453 demultiplexes the multiplexed data to divide the multiplexed data into a bitstream of video data and a bitstream of audio data, supplies the encoded video data to video signal processor ex455 via synchronous bus ex470, and supplies the encoded audio data to audio signal processor ex454 via synchronous bus ex470. Video signal processor ex455 decodes the video signal using a moving picture decoding method corresponding to the moving picture encoding method described in the above embodiments, and video or a still image included in the linked moving picture file is displayed on display ex458 via display controller ex459. Moreover, audio signal processor ex454 decodes the audio signal and outputs audio from audio output unit ex457. Note that since real-time streaming is becoming more and more popular, there are instances in which reproduction of the audio may be socially inappropriate depending on the user's environment. Accordingly, as an initial value, a configuration in which only video data is reproduced, i.e., the audio signal is not reproduced, is preferable. Audio may be synchronized and reproduced only when an input, such as when the user clicks video data, is received.

Although smartphone ex115 was used in the above example, three implementations are conceivable: a transceiver terminal including both an encoder and a decoder; a transmitter terminal including only an encoder; and a receiver terminal including only a decoder. Further, in the description of the digital broadcasting system, an example is given in which multiplexed data obtained as a result of video data being multiplexed with, for example, audio data, is received or transmitted, but the multiplexed data may be video data multiplexed with data other than audio data, such as text data related to the video. Moreover, the video data itself rather than multiplexed data maybe received or transmitted.

Although main controller ex460 including a CPU is described as controlling the encoding or decoding processes, terminals often include GPUs. Accordingly, a configuration is acceptable in which a large area is processed at once by making use of the performance ability of the GPU via memory shared by the CPU and GPU or memory including an address that is managed so as to allow common usage by the CPU and GPU. This makes it possible to shorten encoding time, maintain the real-time nature of the stream, and reduce delay. In particular, processing relating to motion estimation, deblocking filtering, sample adaptive offset (SAO), and transformation/quantization can be effectively carried out by the GPU instead of the CPU in units of, for example pictures, all at once.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to, for example, encoders which encode images and decoders which decode encoded images, such as a television, a digital video recorder, a car navigation system, a mobile phone, a digital camera, and a digital video camera.

What is claimed is:
1. An encoder, comprising:
processing circuitry; and
a memory coupled to the processing circuitry, wherein using the memory, the processing circuitry
    defines at least one parameter for each of plural types of segment identification information for identifying block types,
    splits an image into blocks, assigns, to each of the blocks, segment identification information according to a type of the block, among the plural types of segment identification information, and encodes each of the blocks, and in encoding each of the blocks, the processing circuitry identifies, among the plural types of segment identification information, segment identification information assigned to a current block to be encoded among the blocks, and encodes the current block using the at least one parameter defined for the segment identification information identified, and the at least one parameter includes a parameter for identifying probability information associated with context used in context-based adaptive binary arithmetic coding (CABAC).

2. The encoder according to claim 1, wherein the processing circuitry further encodes block split information indicating a split pattern of the image.

3. The encoder according to claim 1, wherein the processing circuitry further includes, in a picture parameter set, the at least one parameter defined for each of the plural types of segment identification information, and the image split by the processing circuitry is a picture.

4. The encoder according to claim 1, wherein in defining the at least one parameter, the processing circuitry defines the at least one parameter for a combination of one of the plural types of segment identification information and one of plural types of size identification information for identifying block sizes, and in encoding the current block, the processing circuitry encodes the current block using the at least one parameter defined for a combination of the segment identification information identified and size identification information according to a size of the current block among the plural types of size identification information.

5. A decoder, comprising:
processing circuitry; and
a memory coupled to the processing circuitry, wherein using the memory, the processing circuitry
decodes at least one parameter defined for each of plural types of segment identification information for identifying block types,
identifies blocks included in an image,
decodes segment identification information assigned to each of the blocks, and
decodes each of the blocks, and in decoding each of the blocks, the processing circuitry identifies, among the plural types of segment identification information, segment identification information assigned to a current block to be decoded among the blocks, and decodes the current block using the at least one parameter defined for the segment identification information identified, and the at least one parameter includes a parameter for identifying probability information associated with context used in context-based adaptive binary arithmetic coding (CABAC).

6. The decoder according to claim 5, wherein in identifying the blocks, the processing circuitry decodes block split information indicating a split pattern of the image, and identifies blocks included in the image, based on the block split information.

7. The decoder according to claim 5, wherein in decoding the at least one parameter, the processing circuitry extracts from a picture parameter set and decodes the at least one parameter defined for each of the plural types of segment identification information, and the image which includes the blocks identified by the processing circuitry is a picture.

8. The decoder according to claim 5, wherein in decoding the at least one parameter, the processing circuitry identifies the at least one parameter defined for a combination of one of the plural types of segment identification information and one of plural types of size identification information for identifying block sizes, and in decoding the current block, the processing circuitry decodes the current block using the at least one parameter defined for a combination of the segment identification information identified and size identification information according to a size of the current block among the plural types of size identification information.

9. An encoding method for encoding an image, comprising:
defining at least one parameter for each of plural types of segment identification information for identifying block types;
splitting the image into blocks;
assigning, to each of the blocks, segment identification information according to a type of the block, among the plural types of segment identification information; and
encoding each of the blocks, wherein
in encoding each of the blocks,
among the plural types of segment identification information, segment identification information assigned to a current block to be encoded among the blocks is identified, and
the current block is encoded using the at least one parameter defined for the segment identification information identified, and
the at least one parameter includes a parameter for identifying probability information associated with context used in context-based adaptive binary arithmetic coding (CABAC).

10. A decoding method for decoding an encoded image, comprising:
decoding at least one parameter defined for each of plural types of segment identification information for identifying block types;
identifying blocks included in the encoded image;
decoding segment identification information assigned to each of the blocks; and
decoding each of the blocks, wherein
in decoding each of the blocks,
among the plural types of segment identification information, segment identification information assigned to a current block to be decoded among the blocks is identified, and
the current block is decoded using the at least one parameter defined for the segment identification information identified, and
the at least one parameter includes a parameter for identifying probability information associated with context used in context-based adaptive binary arithmetic coding (CABAC).

* * * * *